(12) United States Patent
Gowda et al.

(10) Patent No.: US 9,953,913 B1
(45) Date of Patent: Apr. 24, 2018

(54) ELECTRONICS PACKAGE WITH EMBEDDED THROUGH-CONNECT STRUCTURE AND METHOD OF MANUFACTURING THEREOF

(71) Applicant: General Electric Company, Schenectady, NY (US)

(72) Inventors: Arun Virupaksha Gowda, Rexford, NY (US); Raymond Albert Fillion, Niskayuna, NY (US); Paul Alan McConnelee, Albany, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 15/375,771

(22) Filed: Dec. 12, 2016

(51) Int. Cl.
*H01L 23/04* (2006.01)
*H01L 23/498* (2006.01)
(Continued)

(52) U.S. Cl.
CPC .... *H01L 23/49838* (2013.01); *H01L 21/4846* (2013.01); *H01L 21/56* (2013.01); *H01L 23/3121* (2013.01); *H01L 23/3735* (2013.01); *H01L 23/4985* (2013.01); *H01L 23/49827* (2013.01); *H01L 23/66* (2013.01); *H01L 24/05* (2013.01); *H01L 25/072* (2013.01);
(Continued)

(58) Field of Classification Search
CPC ..... H01L 23/5389; H01L 24/19; H01L 24/24; H01L 24/82; H01L 21/568; H01L 2224/12105; H01L 2224/19; H01L 2224/221; H01L 23/5385; H01L 23/3735; H01L 23/49844; H01L 23/49894; H01L 23/49838; H01L 21/4846; H01L 21/56; H01L 23/3121

USPC .......... 257/690, 698, 707, 728, 774; 438/25, 438/112, 118
See application file for complete search history.

(56) References Cited

U.S. PATENT DOCUMENTS 5,270,493 A 12/1993 Inoue et al.
7,323,762 B2 1/2008 Lai et al.
(Continued)

FOREIGN PATENT DOCUMENTS

CN 100533698 C 8/2009

OTHER PUBLICATIONS

Chason et al., "Toward Manufacturing Low-Cost, Large-Area Electronics", ip.com, https://priorart.ip.com/IPCOM/000141247, Jun. 1, 2006.

*Primary Examiner* — Shahed Ahmed
(74) *Attorney, Agent, or Firm* — Ziolkowski Patent Solutions Group, SC

(57) ABSTRACT

An electronics package includes an insulating substrate, a semiconductor device having a top surface coupled to a first side of the insulating substrate, and a pass-through component coupled to the first side of the insulating substrate. The pass-through component includes an insulating core and at least one through-hole structure comprising a conductive body extending through the thickness of the insulating core. A metallization layer is formed on a second side of the insulating substrate and extends through at least one via in the insulating substrate to electrically couple at least one conductive pad on the top surface of the semiconductor device to the at least one through-hole structure. An insulating material surrounds the semiconductor device and the insulating core of the pass-through component.

27 Claims, 15 Drawing Sheets

(51) Int. Cl.
*H01L 23/31* (2006.01)
*H01L 23/66* (2006.01)
*H01L 21/48* (2006.01)
*H01L 21/56* (2006.01)
*H01L 23/373* (2006.01)
*H01L 25/07* (2006.01)
*H01L 23/00* (2006.01)

(52) U.S. Cl.
CPC .... *H01L 24/32* (2013.01); *H01L 2224/32245* (2013.01); *H01L 2924/10253* (2013.01); *H01L 2924/13055* (2013.01); *H01L 2924/13091* (2013.01); *H01L 2924/19043* (2013.01)

(56) References Cited

U.S. PATENT DOCUMENTS

| | | |
|---|---|---|
| 8,941,208 B2 | 1/2015 | Chauhan et al. |
| 8,987,876 B2 | 3/2015 | Gowda et al. |
| 9,171,785 B2 | 10/2015 | Gowda et al. |
| 2003/0162386 A1 | 8/2003 | Ogawa et al. |
| 2010/0096743 A1 | 4/2010 | Ganesan et al. |
| 2010/0127345 A1* | 5/2010 | Sanders .............. H01L 21/6835 257/528 |
| 2012/0161331 A1* | 6/2012 | Gonzalez ................ H01L 24/19 257/774 |
| 2015/0022985 A1 | 1/2015 | Na et al. |
| 2015/0084207 A1 | 3/2015 | Chauhan et al. |
| 2016/0104741 A1* | 4/2016 | Enichlmair ............. G01J 5/048 257/49 |

* cited by examiner

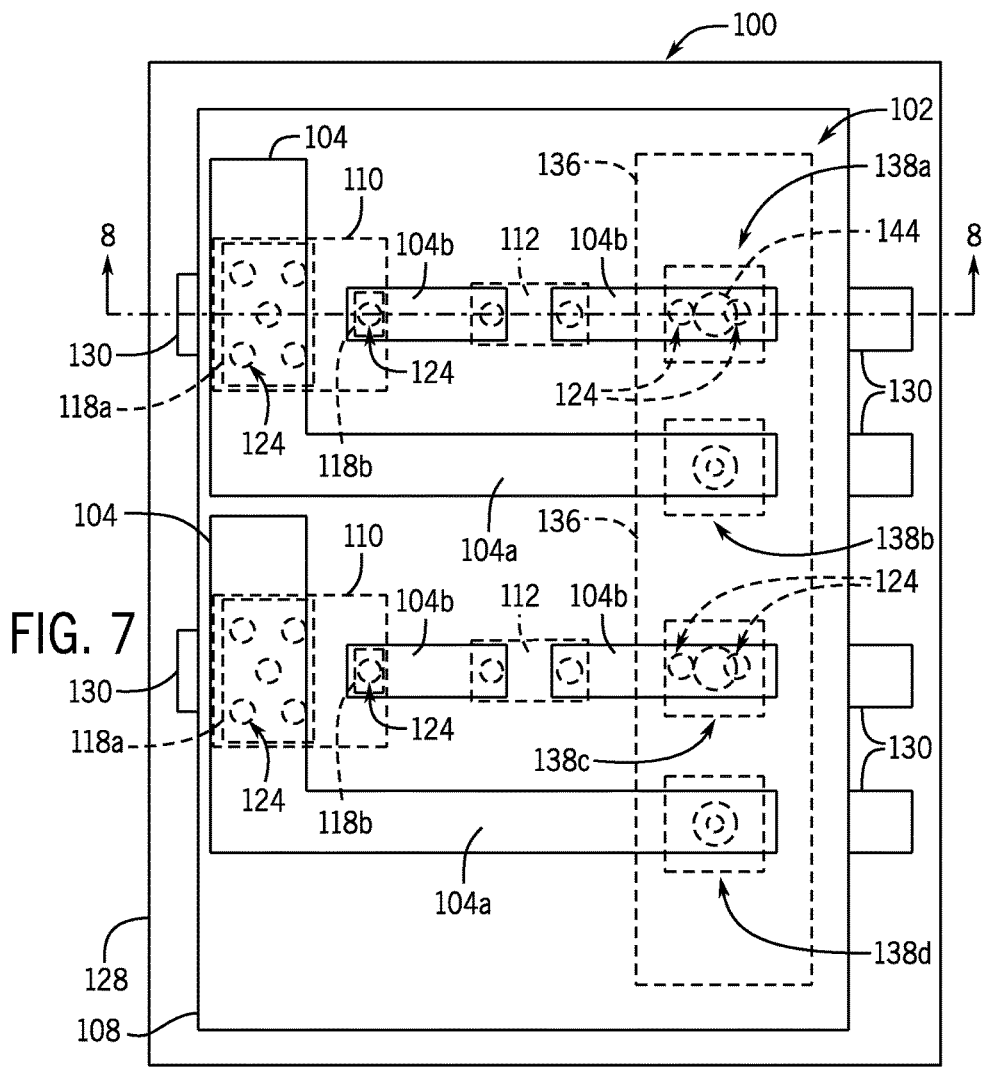
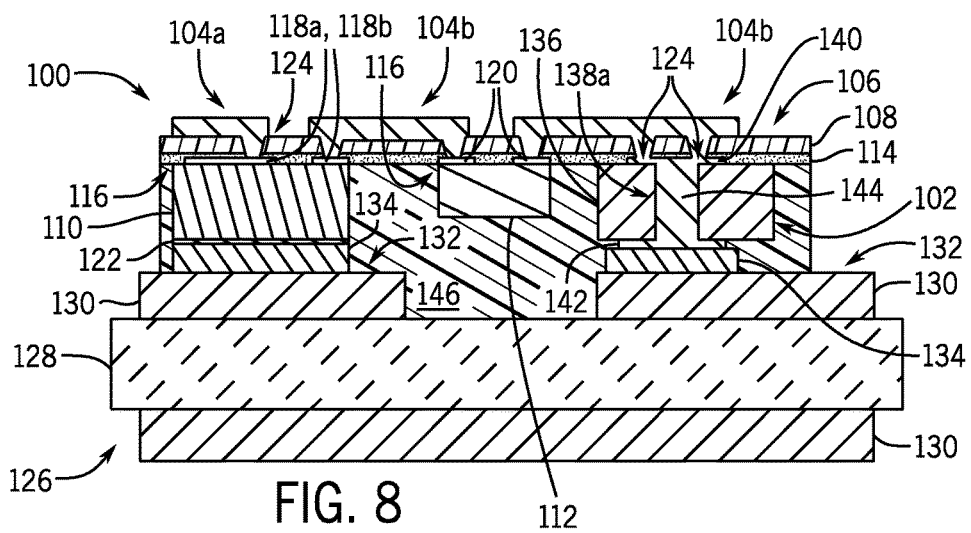

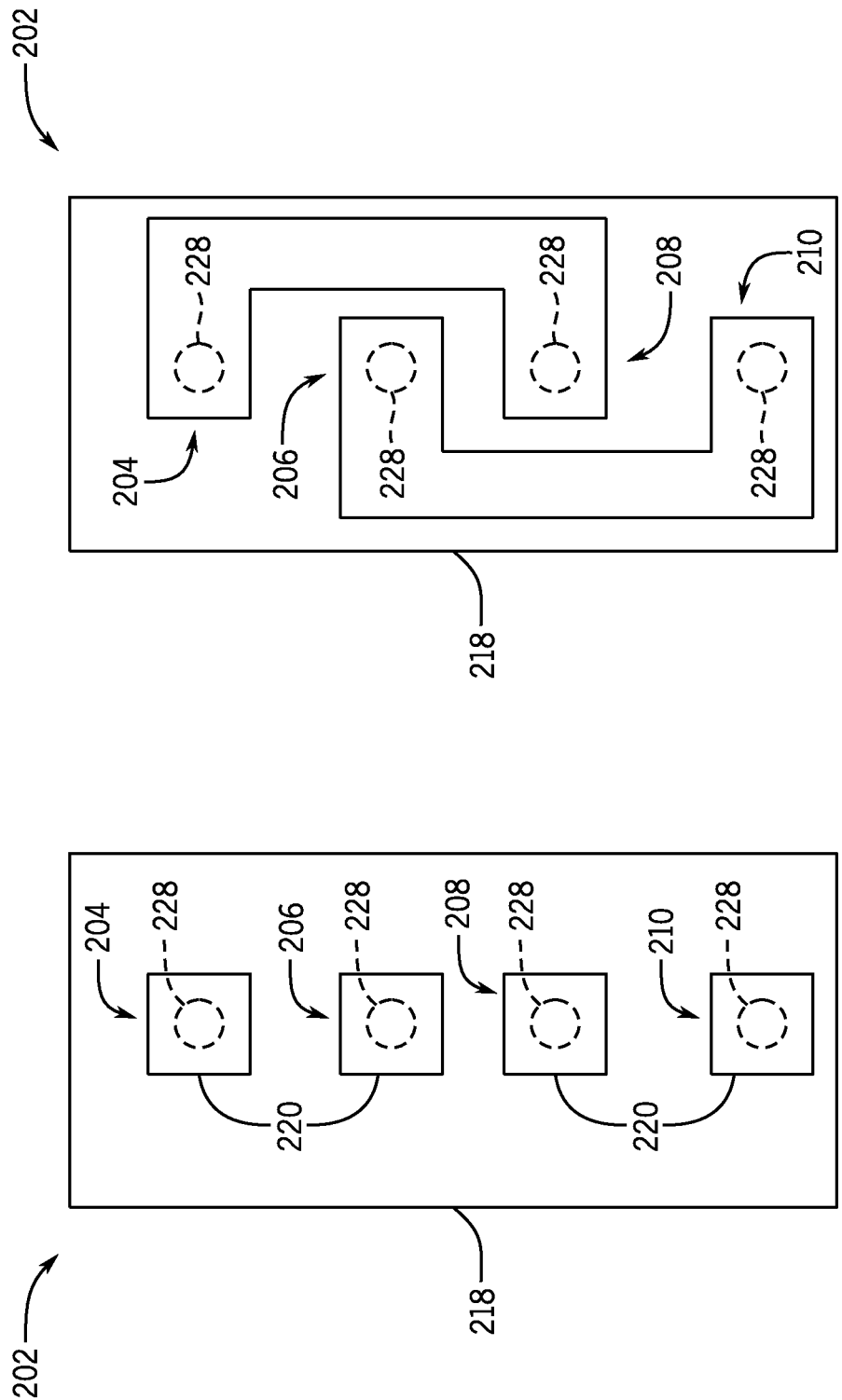

ELECTRONICS PACKAGE WITH EMBEDDED THROUGH-CONNECT STRUCTURE AND METHOD OF MANUFACTURING THEREOF

BACKGROUND OF THE INVENTION

Embodiments of the invention relate generally to semiconductor device packages or electronics packages and, more particularly, to an electronics package that includes an embedded structure containing multiple conductive through-connects and/or resistors. The inclusion of multiple conductive through-connects and/or resistors into a single embedded structure, and the integration thereof along with power devices in the electronics package, provides a simplified manufacturing process, lower cost, and pre-testability of the conductor/resistor structure.

As semiconductor device packages have become increasingly smaller and yield better operating performance, packaging technology has correspondingly evolved from leaded packaging, to laminated-based ball grid array (BGA) packaging, to chip scale packaging (CSP), then flipchip packages, and now buried die/embedded chip build-up packaging. Such embedded chip packages can include one or more packaged components therein in the form of power semiconductor devices, packaged controllers, or other discrete electrical components such as inductors or passive components, to which electrical connections are made by way of metalized interconnects formed in the package structure. The power semiconductor devices in the package may be used as switches or rectifiers in power electronic circuits, such as switched mode power supplies, for example. Most power semiconductor devices are only used in commutation mode (i.e., they are either on or off), and are therefore optimized for this. One such power semiconductor device is a high performance, wideband gap silicon carbide (SiC) MOSFET, which has very fast switching transitions and can be used as a power or high frequency device.

A general construction of an embedded chip package 10 is illustrated in FIG. 1, with a standard technique for manufacturing such an embedded chip package described here below. The manufacturing process typically begins with placement of one or more components—including semiconductor devices 12 and other discrete electrical components 14—onto a dielectric layer 16 by way of an adhesive 18, with the semiconductor devices 12 and associated components 14 being provided in a planar arrangement. Metal interconnects (e.g., copper interconnects) 20 are then electroplated onto the dielectric layer 16 to form a direct metallic connection to the components 12, 14. The metal interconnects 20 may be in the form of a low profile (e.g., less than 200 micrometers thick), planar interconnect structure that provides for formation of an input/output (I/O) system to and from the components 12, 14. A multi-layer ceramic substrate 22 (Alumina with direct bonded copper (DBC), Aluminum Nitride with active metal brazing copper, etc.) is then soldered to a backside of one or more of the components 12, 14 using soldered interconnections for electrical and thermal connectivity, with shims 24 (e.g., copper shims) or other vertical electrical connectors being used as necessary to bring all electrical connections to the multi-layer ceramic substrate 22. The gaps around the components between the dielectric layer and the ceramic substrate are then filled with a dielectric organic material 26 using either capillary flow (capillary underfill), no-flow underfill, or injection molding (molding compounds) to form the package structure 10.

As shown in FIG. 1, in the case of packaging a power semiconductor switch 12, such as an IGBT or MOSFET, typically such switches require a gate resistor 14 for each gate connection. For SiC MOSFETs especially, the resistor is not integrated into the device itself, which means that an external gate resistor 14 must be added so that the switching performance of the device 12 can be controlled. For each gate resistor 14, at least one associated copper shim 24 is also added to serve as a vertical electrical connector to the multi-layer ceramic substrate. In existing packaging techniques, the addition of each of the external gate resistors 14 and the shims 24 is done individually via a pick and place operation. Accordingly, numerous, discrete pick and place operations are required to position the external gate resistors 14 and the shims 24 into adhesive 18, leading to increased fabrication time, yield issues, and increased cost associated with the use of individual shims.

Accordingly, it would be desirable to provide a new electronics packaging technology that addresses the aforementioned drawbacks associated with existing pick and place operations for providing each of the individual external gate resistors and the shims when packaging power semiconductor switches. It would further be desirable for such a packaging technology to provide a simplified manufacturing process, lower cost, and enable pre-testing of the resistors and shims prior to embedding the components within the package structure.

BRIEF DESCRIPTION OF THE INVENTION

In accordance with one aspect of the invention, an electronics package includes an insulating substrate, a semiconductor device having a top surface coupled to a first side of the insulating substrate, and a pass-through component coupled to the first side of the insulating substrate. The pass-through component includes an insulating core and at least one through-hole structure comprising a conductive body extending through the thickness of the insulating core. A metallization layer is formed on a second side of the insulating substrate and extends through at least one via in the insulating substrate to electrically couple at least one conductive pad on the top surface of the semiconductor device to the at least one through-hole structure. An insulating material surrounds the semiconductor device and the insulating core of the pass-through component.

In accordance with another aspect of the invention, a method of manufacturing an electrical package includes providing an insulating substrate, coupling a semiconductor device to a first surface of the insulating substrate, and coupling a pass-through structure to the first surface of the insulating substrate, the pass-through structure comprising a core substrate and at least one electrical feed through extending through a thickness of the core substrate. The method also includes forming a first metallization path on a second surface of the insulating substrate, the first metallization path extending through at least one via in the insulating substrate to electrically couple at least one pad of the semiconductor device to at least one electrical feed through of the pass-through structure. The method further includes applying an insulating material about the semiconductor device and the core substrate of the pass-through structure.

In accordance with yet another aspect of the invention, an electronics package includes a plurality of semiconductor devices coupled to a first side of an insulating substrate and at least one structure coupled to the first side of the insulating substrate. The at least one structure includes an insulating core and a plurality of electrically conducting through-hole structures extending through the insulating core and across a portion of a top surface and a portion of a bottom surface thereof. A metallization layer is formed on a second surface of the insulating substrate and extends through a plurality of vias therein. An insulating material is applied around the plurality of semiconductor devices and the insulating core. The metallization layer electrically connects at least one contact pad of a first semiconductor device of the plurality of semiconductor devices to at least one electrically conducting through-hole structure of the plurality of electrically conducting through-hole structures. The metallization layer also electrically connects at least one contact pad of a second semiconductor device of the plurality of semiconductor devices to at least one other electrically conducting through-hole structure of the plurality of electrically conducting through-hole structures.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

In the drawings:

FIG. 7 is a schematic top view of an electronics package, according to another embodiment of the invention.

FIG. 8 is a schematic cross-sectional side view of the electronics package of FIG. 7, taken along line 8-8.

FIG. 23 is a schematic top view of a pass-through structure embedded within the electronics package of FIG. 21, according to an embodiment of the invention.

FIG. 24 is a schematic bottom view of the embedded pass-through structure of the electronics package of FIG. 21, according to an embodiment of the invention.

DETAILED DESCRIPTION

Figure 1:
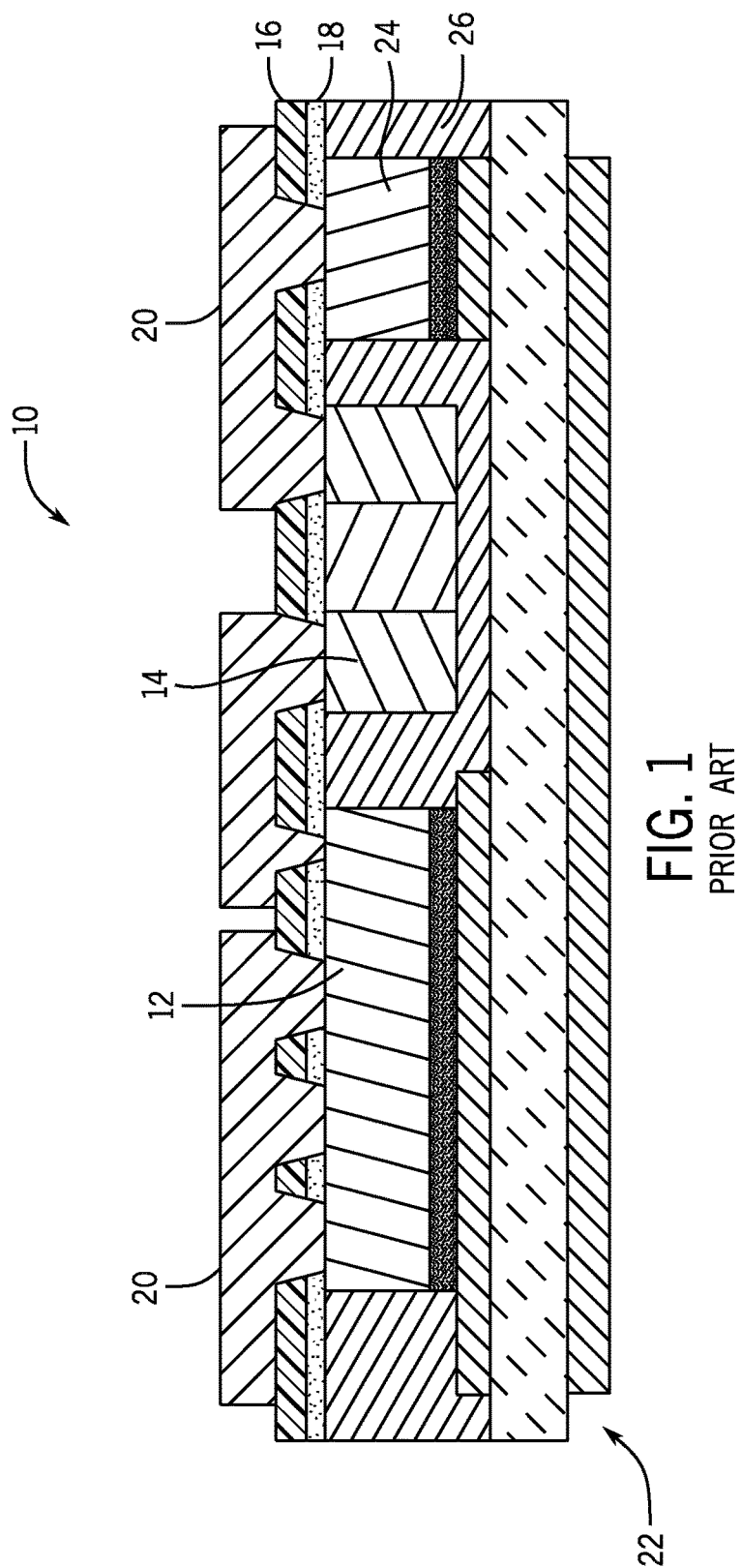
FIG. 1 is a schematic cross-sectional side view of a prior art electronics package incorporating discrete gate resistors and shim elements therein.

Embodiments of the present invention provide for an electronics package that includes multiple electrically conductive through-connects and/or resistors integrated therein in a common embedded structure. The embedded structure is prefabricated, meaning that it is fabricated during a manufacturing process that occurs prior to and separate from the build-up of the electronics package. The embedded structure facilitates placement of multiple through-connects and/or resistors within the electronics package, reduces manufacturing costs, and can be pre-tested prior to integration with electronics package thereby improving package yield.

As used herein, the phrase "power semiconductor device" refers to a semiconductor component, device, die or chip designed to carry a large amount of current and/or support a large voltage. Power semiconductor devices are typically used as electrically controllable switches or rectifiers in power electronic circuits, such as switched mode power supplies, for example. Non-limiting examples of power semiconductor devices include insulated gate bipolar transistors (IGBTs), metal oxide semiconductor field effect transistors (MOSFETs), bipolar junction transistors (BJTs), integrated gate-commutated thyristors (IGCTs), gate turn-off (GTO) thyristors, Silicon Controlled Rectifiers (SCRs), diodes or other devices or combinations of devices including materials such as Silicon (Si), Silicon Carbide (SiC), Gallium Nitride (GaN), and Gallium Arsenide (GaAs). In use, power semiconductor devices are typically mounted to an external circuit by way of a packaging structure, with the packaging structure providing an electrical connection to the external circuit and also providing a way to remove the heat generated by the devices and protect the devices from the external environment. Typical power semiconductor devices include input/output (I/O) interconnections, referred to herein as contact pads or connection pads, which are used to connect both sides of a respective power semiconductor device to an external circuit and are electrically coupled to internal contacts within the semiconductor device.

While the various embodiments of an electronics package referenced below are shown and described as including a particular arrangement of power semiconductor devices and associated electrical components therein, it is understood that other combinations of differently configured electrical components could also be included in the electronics package, and thus embodiments of the invention are not limited only to the specifically illustrated devices and arrangement thereof. That is, the electronics package embodiments described below should also be understood to encompass electronics packages that might include additional power semiconductor devices and/or one or more alternative types of semiconductor devices including acoustic devices, sensors, wide band gap semiconductor devices, and high frequency semiconductor devices such as microwave semiconductor devices, millimeter microwave semiconductor devices, and RF communication semiconductor devices. As used herein "wide band gap semiconductor devices" refers to semiconductor devices constructed of a material having a band gap greater than approximately 2.0 electronvolts (eV) including for example Silicon Carbide (SiC), Aluminum nitride (AlN), Gallium nitride (GaN), and Boron nitride (BN). The electronics packages described herein may also include additional resistors, capacitors, inductors, filters, or other similar devices, provided in combination with one or more power devices.

Figure 2:
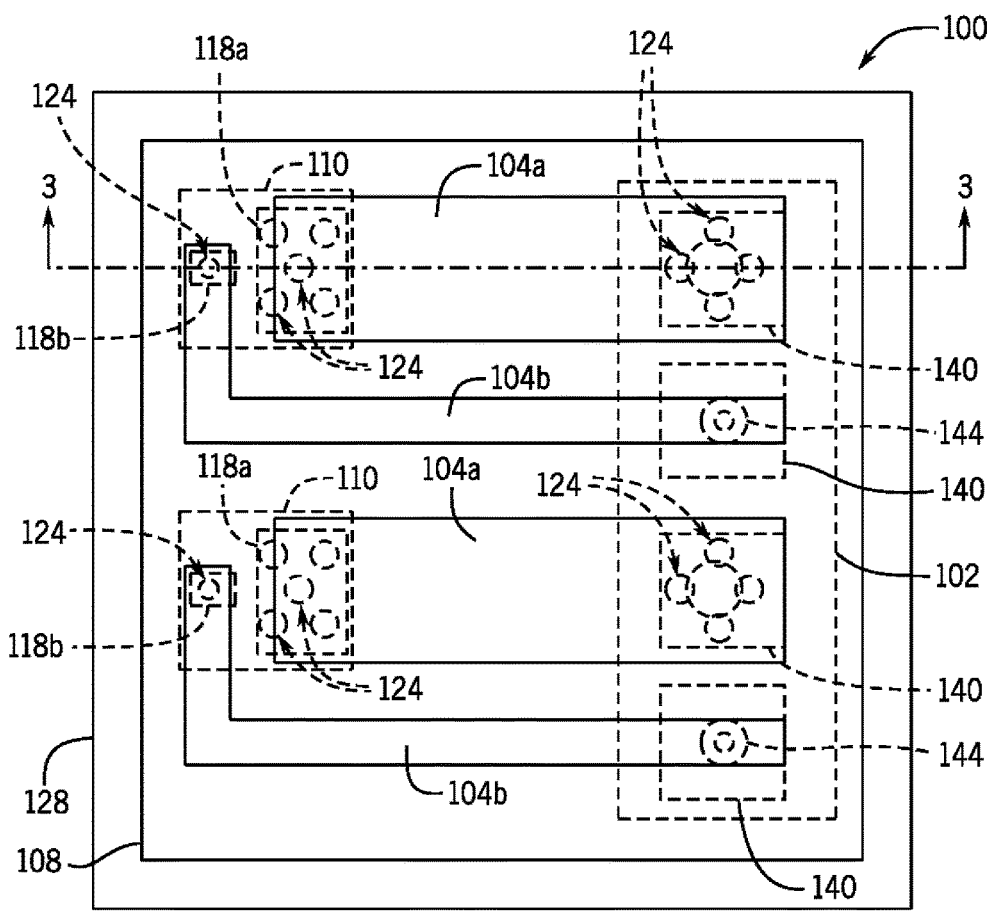
FIG. 2 is a schematic top view of an electronics package, according to an embodiment of the invention.
Figure 3:
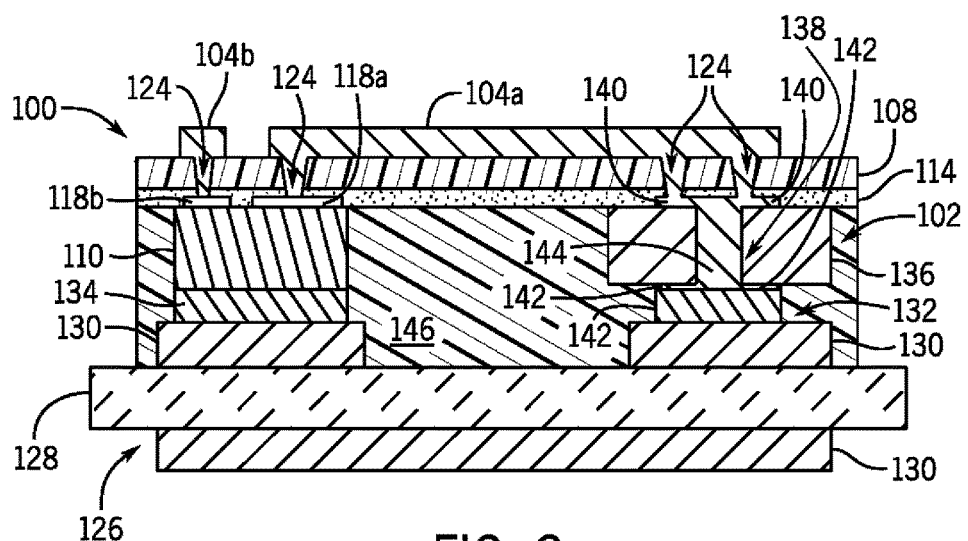
FIG. 3 is a schematic cross-sectional side view of the electronics package of FIG. 2, taken along line 3-3.
Figure 4:
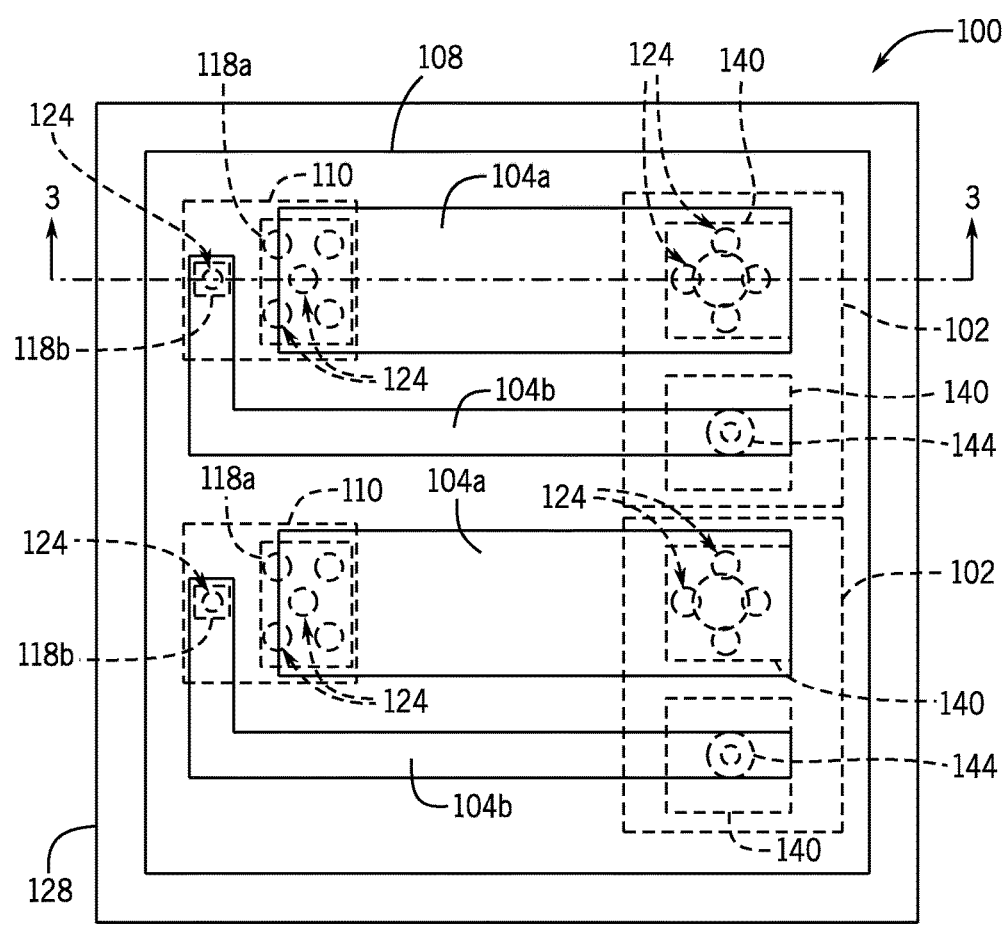
FIG. 4 is a schematic top view of an electronics package, according to another embodiment of the invention.
Figure 5:
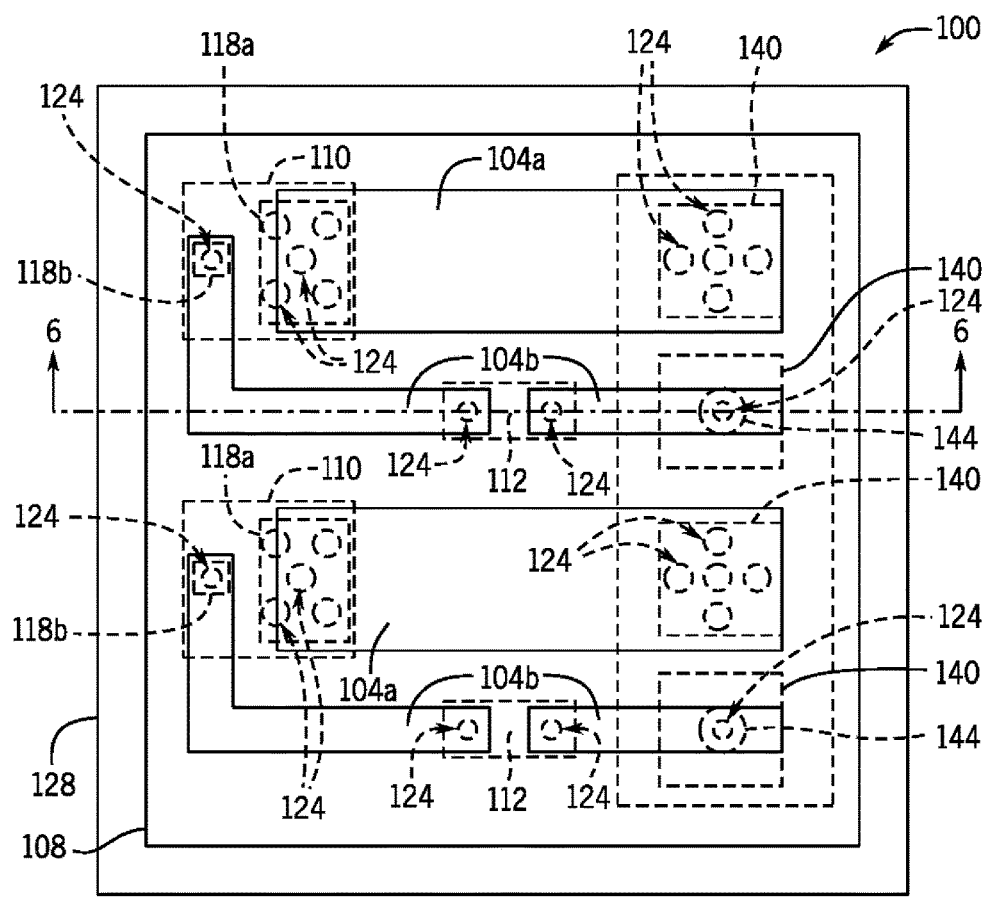
FIG. 5 is a schematic top view of an electronics package, according to another embodiment of the invention.

FIGS. 2, 4, 5, and 7 are schematic top views of an electronics package 100 that includes at least one pass-through component or embedded structure 102, according to alternative embodiments of the invention. Corresponding cross-sectional views of the electronics packages 100 of FIGS. 2, 5, and 7 are provided in FIGS. 3, 6, and 8. As described in additional detail below, the electronics package 100 may include a single embedded structure 102 incorporating all of the conductive through-hole structures provided within the electronics package 100, as shown in FIGS. 2, 5, and 7, or multiple embedded structures 102 each including at least two conductive through-hole structures, as shown in FIG. 4. In an alternative embodiment, the electronics package may include an embedded structure having a single conductive through-hole structure.

Referring now to FIGS. 2-8 together as appropriate, schematic top views of an electronics package 100 that includes at least one embedded structure 102 therein are provided, according to alternative embodiments of the invention. The electronics package 100 includes a conductor layer or metallization layer 104 formed on a top surface 106 of an insulating substrate 108. According to various embodiments, insulating substrate 108 may be provided in the form of an insulating film or dielectric substrate, such as for example a Kapton® laminate flex, although other suitable materials may also be employed, such as Ultem®, polytetrafluoroethylene (PTFE), or another polymer film, such as a liquid crystal polymer (LCP) or a polyimide substrate, as non-limiting examples.

One or more semiconductor devices 110 are coupled to a bottom surface of insulating substrate 108. In the embodiments shown in FIGS. 5 and 7, electronics package 100 further includes one or more additional electrical components 112 coupled to the bottom surface of insulating substrate 108. In embodiments where semiconductor devices 110 are power semiconductor switches, such as IGBTs or SiC MOSFETs for example, electrical components 112 are gate resistors operable with power semiconductor switches 110. While not shown, it is recognized that additional semiconductor devices, in the form of diodes for example, may be included in package 100 and operable with power semiconductor switches 110. Additionally gate resistors 112 may be omitted in alternative embodiments. In one embodiment, a layer of insulating adhesive 114 is used to affix power semiconductor switches 110 and gate resistors 112 to insulating substrate 108. As used herein, the phrases "insulating adhesive" refers to an electrical insulator that adheres to surrounding components of the electronics package such as a polymeric material (e.g., epoxy) or organic material as anon-limit example. In some embodiments, insulating adhesive 114 may be provided in either an uncured or partial cured (i.e., B-stage) form. In alternative embodiments, power semiconductor switches 110 and gate resistors 112 may be affixed to insulating substrate 108 by way of an adhesive property of the insulating substrate itself. In such an embodiment, insulating adhesive 114 is omitted and insulating substrate 108 is provided in the form of a single dielectric layer having adhesive properties. Non-limiting examples of such an adhesive dielectric layer include a spin-on dielectric such as polyimide or polybenzoxzaole (PBO).

Figure 6:
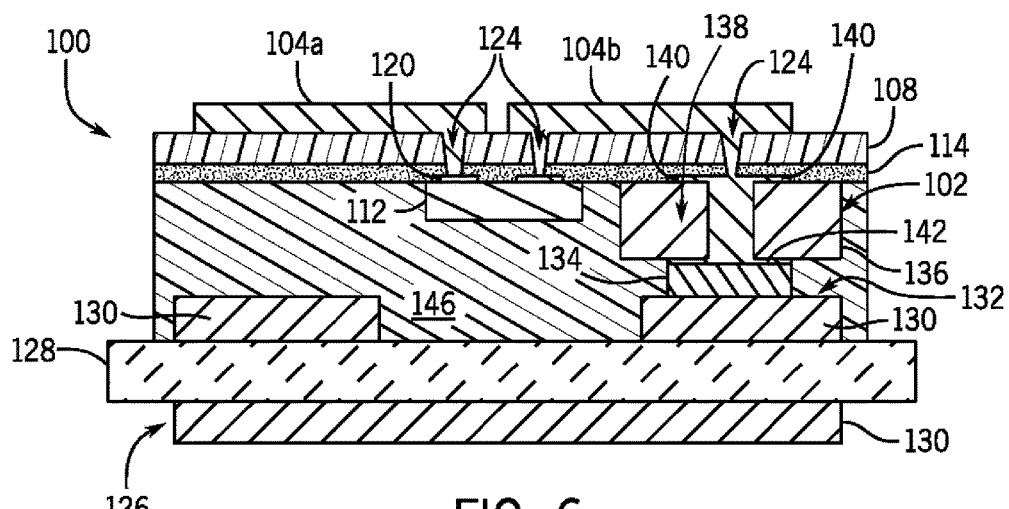
FIG. 6 is a schematic cross-sectional side view of the electronics package of FIG. 5, taken along line 6-6.

As shown in FIGS. 3 and 8, each power semiconductor switch 110 is positioned such that a top surface or an active surface 116 comprising electrical contact pads or connection pads 118 is positioned into insulating adhesive 114. Gate resistors 112, shown in FIGS. 6 and 8, are likewise positioned such that electrical contact pads or connection pads 120 are positioned into insulating adhesive 114. Contact pads 118, 120 provide conductive routes (I/O connections) to internal contacts within each device. Contact pads 118, 120 may have a composition that includes a variety of electrically conductive materials such as aluminum, copper, gold, silver, nickel, or combinations thereof as non-limiting examples. For power semiconductor switch 110, which as indicated previously may be an IGBT or SiC MOSFET, contact pads 118—including pads 118a, 118b—are coupled to corresponding emitter/source and/or gate regions of the switch, with it being recognized that one of contact pads 118a, 118b provides a gate connection from the power semiconductor switch 110 to the gate resistor 112. In the illustrated embodiment, power semiconductor switch 110 optionally also includes at least one lower contact pad or collector/drain pad 122 that is disposed on its backside or lower surface. In an alternative embodiment where device 110 is a high frequency semiconductor device, pad 118b is an input connection to device 110.

The conductor layer 104 is an electrically conductive material that creates a series of electrical connections to the contact pads 118, 120 of power semiconductor switches 110 and gate resistors 112. In one embodiment, conductor layer 104 is formed of copper. However, other electrically conducting materials or a combination of metal and a filling agent may be used in other embodiments. As described in more detail below, conductor layer 104 may also include an interstitial seed metal layer (not shown). Conductor layer 104 extends through a series of vias 124 formed through a thickness of insulating substrate 108 to connect to contact pads 118, 120 on the respective power semiconductor switches 110 and gate resistors 112.

As further shown in FIGS. 3, 6, and 8, a multi-material conductor substrate 126 is also provided in electronics package 100 and forms part of the bottom surface of the package. According to one embodiment, the multi-layer conductor substrate 126 comprises an inorganic dielectric such as for example alumina, BeO or SiC and top and bottom metal such as for example copper or aluminum. According to another embodiment, the multi-material conductor substrate 126 is constructed as a direct bond copper (DBC) structure that is composed of a ceramic core 128 (e.g., alumina) with a sheet of copper 130 bonded to both sides thereof by a direct bond joining process (i.e., copper pattern on die side of ceramic tile and balancing copper on non-die side). Alternatively, it is recognized that other similar structures could also be employed, such as an insulated metal substrate (IMS) structure, for example, that provides electrical insulation—but not ideal thermal conductivity, and thus may include thermal pathways formed therethrough.

However, while the multi-material conductor substrate 126 is referred to above and here below as a "DBC structure," it is recognized that the multi-layer conductor substrate may be constructed of other materials, with aluminum being used instead of copper as the metal layer for example, and thus such an embodiment is considered within the scope of the invention. Thus, use of the phrase "multi-material conductor structure" here below is meant to encompass a ceramic substrate that includes an inorganic dielectric or ceramic tile (e.g., alumina) with a sheet of any suitable metallic material (such as copper or aluminum) bonded to one or both sides thereof via any high temperature joining process, including brazing or direct bonding technology or a substrate such as a leadframe that includes an insulating material positioned between adjacent conductors. Alternatively, it is recognized that other similar structures could also be employed, such as an insulated metal substrate (IMS) structure and printed circuit board structures.

The power semiconductor switches 110 in electronics package 100 are coupled to a top surface 132 of the multi-material conductor structure 126 using an electrically conductive joining material 134 such as solder, as one non-limiting example, while a bottom surface of the multi-material conductor structure 126 is left fully or partially exposed to provide efficient heat transfer out from the electronics package 100 and, in one embodiment, provide for conductive coupling of the electronics package 100 to an external board or circuit carrier (not shown). The inclusion of multi-material conductor structure 126 in electronics package 100 serves to electrically isolate/insulate the bottom collector pad or surface 122 of power semiconductor switches 110 (from an external circuit), while still providing an improved thermal pathway to conduct heat away from the power semiconductor switches 110.

For bringing other electrical connections in electronics package to the multi-material conductor structure 126, vertical electrical connectors are additionally included in the electronics package 100. According to exemplary embodiments, the vertical electrical connectors are provided by way of one or more prefabricated, embedded through-connect or pass-through structures 102 incorporated into electronics package 100. The through-connect or pass-through structure 102 is constructed of core substrate or an insulating core 136 or and at least one electrical feed through or through-hole structure 138 that provides vertical electrical connection for semiconductor devices 110 and associated electrical components 112, down through the pass-through structure 102 and to the multi-material conductor structure 126. According to one embodiment, the insulating core 136 is formed of a printed circuit board (PCB) core material, such as, for example, an epoxy material with a fiberglass mat in the center thereof to control the thermal expansion of the structure 102. However, while the insulating core 136 is referred to here and below as a "PCB core" and the prefabricated, embedded pass-through structure 102 as a whole is referred to as a "prefabricated PCB structure," it is recognized that the insulating core 136 may be constructed of other materials, such as a pre-preg material, polyimide film/layer, a ceramic material, a composite dielectric material, or other similar/suitable organic material or inorganic material that exhibits provides mechanical robustness to the prefabricated, embedded pass-through structure. According to one embodiment, the PCB core 136 may also include copper circuitry therein separate and distinct from the through-hole structures 138.

Each of the at least one plated through-hole structures 138 of prefabricated PCB structure 102 includes a top plate 140 formed on a top or first surface of the PCB core 136, a bottom plate 142 formed on a bottom or second surface of the PCB core 136, and a conductive body 144 extending through a thickness of the PCB core 136 to electrically couple the top plate 140 to the bottom plate 142. The conductive body 144 of each plated through-hole structure 138 may be partially plated (i.e., have an opening in the center thereof) or solid, according to alternative embodiments. In one embodiment, the top and bottom plates 140, 142 and the conductive body 144 are formed of copper; however, other electrically conducting materials or a combination of metal and a filling agent may be used in other embodiments. Bottom plates 142 may be formed having a larger surface area than top plates 140, in one embodiment, in order to reduce resistance in soldered connections thereto. However, it is contemplated that bottom plate 142 may be of similar size or smaller than top plate 140 in alternative embodiments. In yet another embodiment, top plate may be omitted entirely, with electrical connections being made directly to a top surface of conductive body 144.

As described in more detail below, an interstitial seed metal layer (not shown) may also be provided between the top and bottom plates 140, 142 and the conductive body 144. The prefabricated PCB structure 102 can have multiple plated through-hole structures 138 providing vertical interconnection for multiple devices and/or multiple pads of the same device. FIG. 2 depicts an electronic package with one prefabricated PCB structure 102 and four plated through-hole structures 138 which are electrically connected to two semiconductor devices 110 and two contact pads 118a, 118b of each device 110. FIG. 4 depicts an electronic package with prefabricated PCB structures 102, each with two plated through-hole structures 138 which are electrically connected to the contact pads of each of two semiconductor devices 110.

The at least one prefabricated PCB structure 102 is coupled to the bottom surface of insulating substrate 108 such that the top surface of the prefabricated PCB structure 102 and the top surface of the semiconductor device 110 are co-planar or substantially co-planar. In one embodiment, a layer of insulating adhesive 114—in the form of an adhering electrically insulating material, such as a polymeric material (e.g., epoxy) or other organic material—is used to affix the prefabricated PCB structure 102 to insulating substrate 108. In an alternative embodiment, the prefabricated PCB structure 102 may be affixed to insulating substrate 108 by way of an adhesive property of the insulating substrate itself, such as when insulating substrate 108 is in the form of Liquid Crystalline Polymer (LCP) or Ajinomoto Build-Up Film (ABF). The top plate 140 of prefabricated PCB structure 102 is connected to conductor layer 104 that extends through vias 124 formed through insulating substrate 108, with the conductor layer 104 electrically coupling gate resistor 112 and power semiconductor switch 110 to top plate 140 of a respective pass-through structure 138. The bottom plate 142 of each respective pass-through structure 138 in prefabricated PCB structure 102 is soldered to the top surface 132 of multi-material conductor structure 126, such that the plated through-hole structures 138 are electrically coupled to the multi-material conductor structure 126.

In some embodiments, power semiconductor switches 110, gate resistors 112, and prefabricated PCB structure 102 are embedded or encapsulated within a layer of electrically insulating material 146, as can be seen in FIGS. 3, 6 and 8. The electrically insulating material 146 may be used to fill in a volume between insulating substrate 108 and multi-material conductor structure 126 and fill in gaps in the electronics package 100, so as to provide rigidity in electronics package and ease of handling. The electrically insulating material 146 may be in the form of a dielectric polymeric underfill or encapsulate or overmold applied using capillary flow (capillary underfill), no-flow underfill, or injection molding (molding compounds), for example. In one embodiment, the material composition of insulating material 146 includes a particulate filler and differs in material composition from the insulating core 136 of PCB structure 102.

As shown in FIGS. 2-8, according to exemplary embodiments, conductor layer 104 is patterned into paths or portions 104a, 104b that electrically couple contact pads 118a, 118b of power semiconductor switches 110 and contact pads 120 of gate resistors 112 to respective plated through-hole structures 138 of prefabricated PCB structure 102. That is, a first conductor layer path or portion 104a is formed to electrically couple the first contact pad 118a (i.e., a power lead connection) of a power semiconductor switch 110 to a first plated through-hole structure 138 of prefabricated PCB structure 102 (i.e., to top plate 140 thereof). As indicated previously, in one embodiment a diode (not shown) may be included in package 100 and operable with each power semiconductor switch 110, and in such an embodiment the first conductor layer portion 104a would electrically couple the first contact pad 118a of a power semiconductor switch 110 to the diode and to a first plated through-hole structure 138. A second conductor layer portion 104b is formed to electrically couple the second contact pad 118b (i.e., a gate connection) of a power semiconductor switch 110 to a second plated through-hole structure 138 of prefabricated PCB structure 102 (i.e., to top plate 140 thereof). The second conductor layer path or portion 104b may further include individual portions or sections therein that electrically couple the second contact pad 118b of a power semiconductor switch 110 to a contact pad 120 of a respective gate resistor 112 and electrically couple the other contact pad 120 of the respective gate resistor 112 to a second plated through-hole structure 138. The respective plated through-hole structures 138 of prefabricated PCB structure 102 thus provide separate vertical electrical connections from contact pads 118a, 118b to multi-material conductor structure 126.

According to alternative embodiments, gate resistors 112 may either be positioned between the semiconductor device 110 and a corresponding through-hole structure 138 such that the semiconductor device 110, gate resistor 112 and through-hole structure 138 are aligned within a common cross section, as shown in FIGS. 7 and 8, or offset therefrom, as shown in FIGS. 5 and 6. In some embodiments the later configuration may be preferred in order to minimize the length of the conductive path between the power lead connection 118a of semiconductor device 110 and its corresponding through-hole structure 138.

The incorporation of multiple pass-through structures 138 in a single prefabricated PCB structure 102, such as that shown in FIG. 2, allows for the addition and positioning of a plurality of vertical electrical connectors in electronics package 100 in a single pick and place operation step. The prefabricated PCB structure 102 can be constructed so as to include a number of pass-through structures 138 therein sufficient to meet connection requirements for the power semiconductor switches 110 and associated resistors 112 (or ground shields, I/O leads, or other electrical components) included in electronics package 100, with the construction of prefabricated PCB structure 102 being configurable based on such requirements. The prefabricated PCB structure 102 thus provides a simpler electronics package manufacturing process and lowers a cost of the electronics package 100, as compared to previous manufacturing processes and electronics packages that utilize numerous, individual shims for providing vertical electrical connections in the electronics package.

In the electronics package 100 shown in FIGS. 2 and 7, prefabricated PCB structure 102 includes pass-through structures 138 that electrically couple with two different power semiconductor switches 110. In alternative embodiments, prefabricated PCB structure 102 may be provided having any number of pass-through structures 138 to enable connections to one or more power semiconductor switches 110. Where prefabricated PCB structure 102 includes pass-through structures 138 that form connections to multiple semiconductor switches 110, the resulting electronics package 100 may be singulated into a number of individual modules, each containing one or more semiconductor switches 110.

Figure 9:
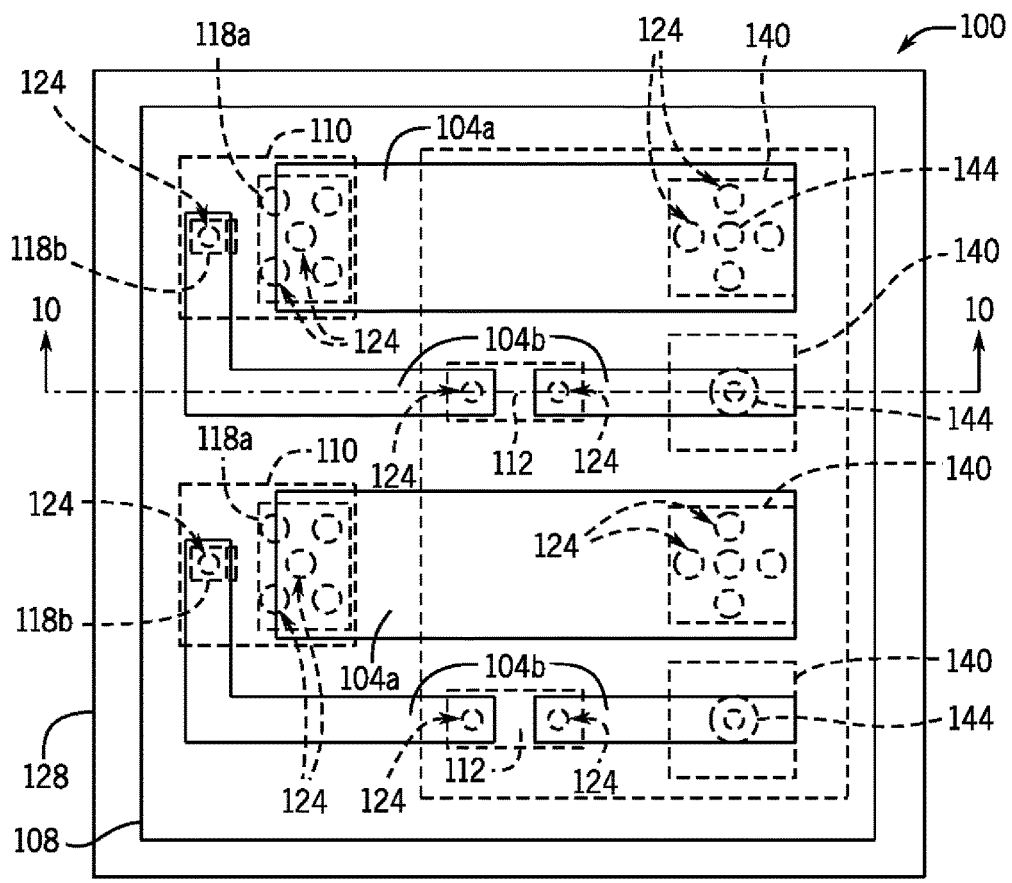
FIG. 9 is a schematic top view of an electronics package, according to another embodiment of the invention.
Figure 10:
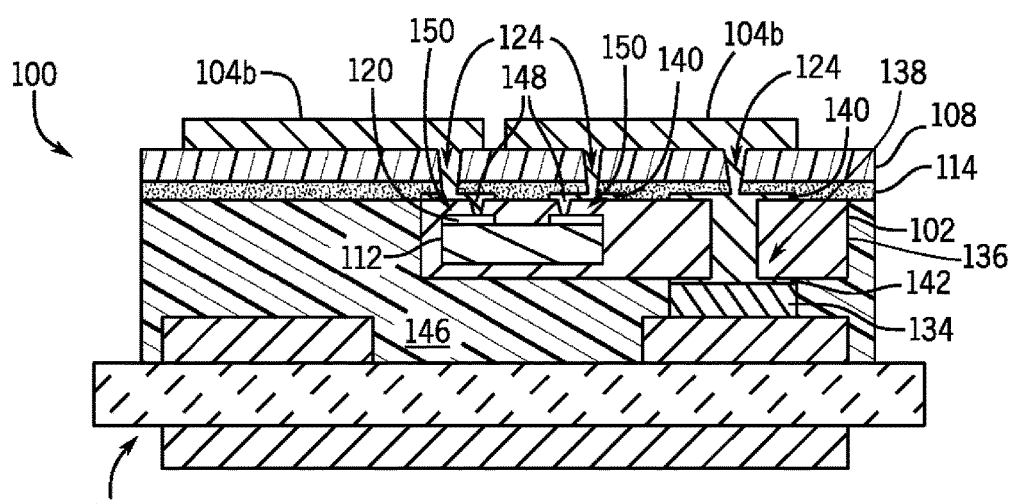
FIG. 10 is a schematic cross-sectional side view of the electronics package of FIG. 9, taken along line 10-10, according to one embodiment of the invention.
Figure 11:
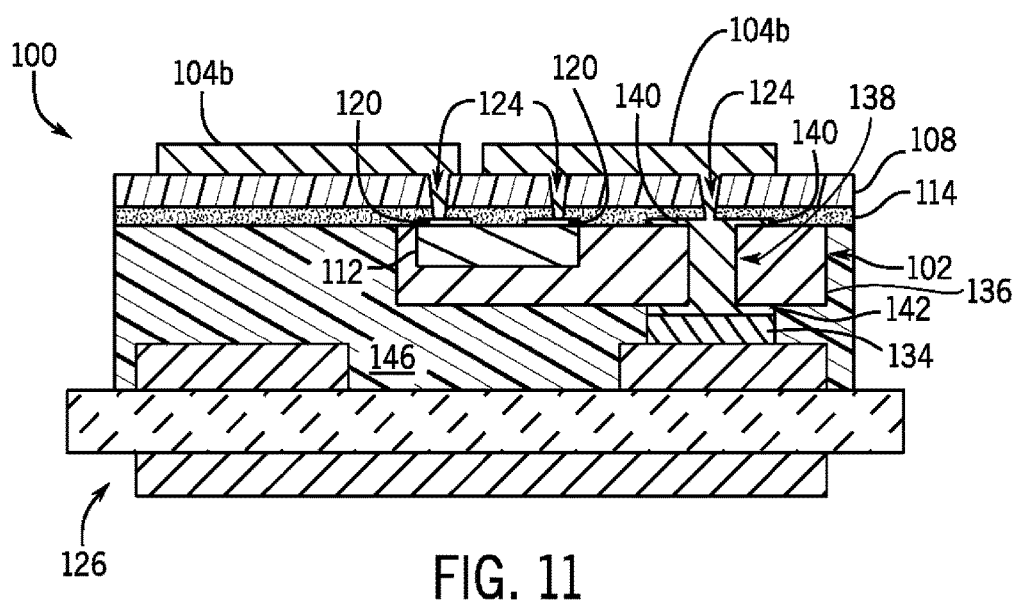
FIG. 11 is a schematic cross-sectional side view of the electronics package of FIG. 9, taken along line 10-10, according to another embodiment of the invention.
Figure 12:
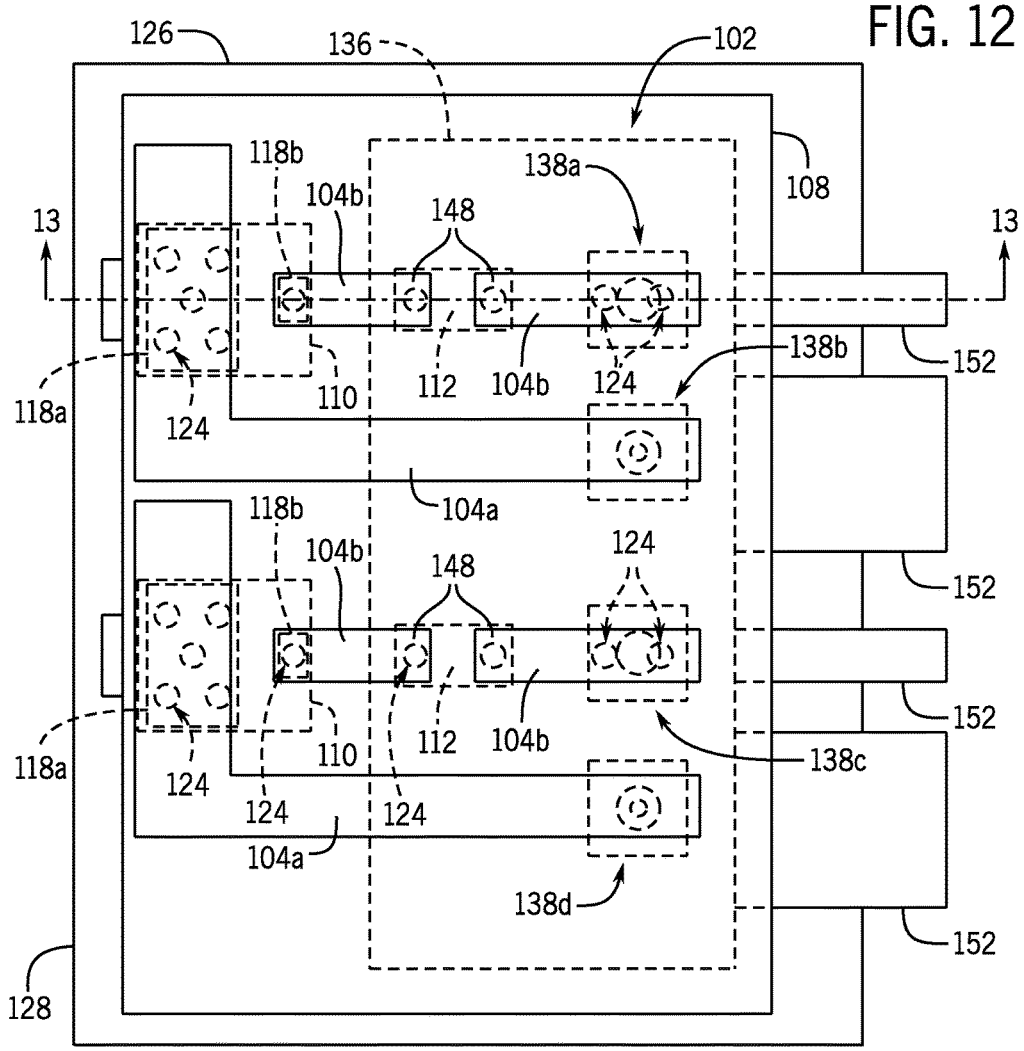
FIG. 12 is a schematic top view of an electronics package, according to another embodiment of the invention.

While FIGS. 2-8 illustrate a prefabricated PCB structure 102 with a basic structure provided by the PCB core 136 and plurality of plated through-hole structures 138, it is recognized that additional electrical components may be incorporated into prefabricated PCB structure 102, according to alternative embodiments. One such alternative embodiment is illustrated in FIGS. 9 and 10, with it being shown therein that gate resistor(s) 112 are incorporated into prefabricated PCB structure 102 rather than being provided as discrete components in electronics package 100. The gate resistors 112 are embedded within the PCB core 136 of the prefabricated PCB structure 102, with patterning and etching steps being performed to provide electrical connections down to the embedded gate resistors 112. More specifically, conductors 148 constructed of an electrically conductive material (e.g., copper or other electrically conducting materials or metal-filling agent combinations) are formed through a series of vias 150 formed in PCB core 136 and down to contact pads 120 of gate resistors 112. The conductors 148 formed in/on the PCB core 136 of prefabricated PCB structure 102 connect to conductor layer 104 (i.e., to second conductor layer portion 104b) that extends through vias 124 formed through insulating substrate 108 and insulating adhesive 114, thereby electrically connecting gate resistors 112 to conductor layer 104. In an alternative embodiment shown in FIG. 11, conductors 148 are omitted from PCB structure 102 and vias 124 are formed through insulating substrate 108 to expose contact pads 120 of resistors 112. In yet another embodiment the resistors 112 are patterned atop the PCB core 136.

The incorporation of gate resistors 112 within or atop in prefabricated PCB structure 102 further reduces the number of pick and place operation steps required during fabrication of the electronics package 100, as the need for individual pick and place operations for each gate resistor 112 in the electronics package are negated. The incorporation of one gate resistors 112 in prefabricated PCB structure 102 also enables pre-testing of the resistors 112 to be performed prior to embedding of the prefabricated PCB structure 102 in the electronics package 100.

Figure 13:
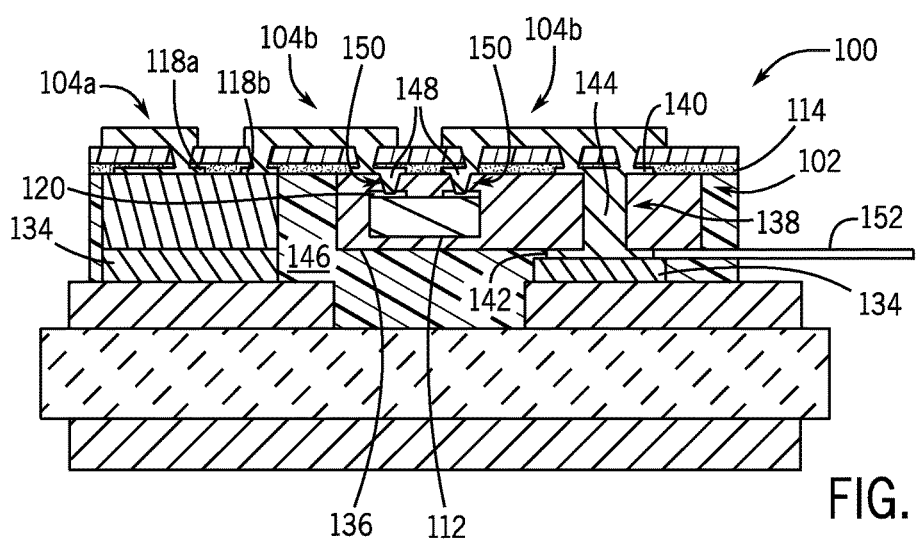
FIG. 13 is a schematic cross-sectional side view of the electronics package of FIG. 12, taken along line 13-13, according to one embodiment of the invention.
Figure 14:
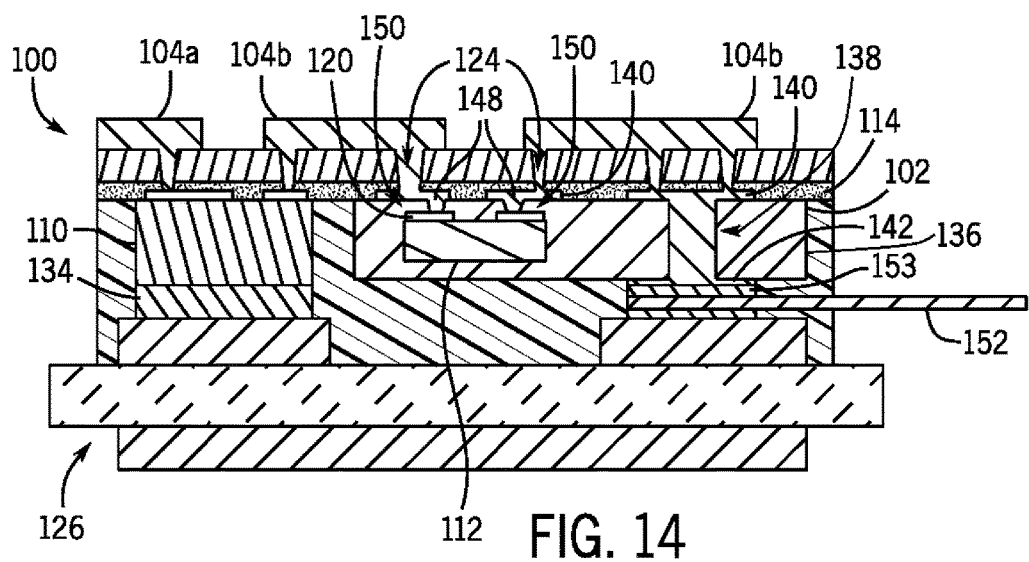
FIG. 14 is a schematic cross-sectional side view of the electronics package of FIG. 12, taken along line 13-13, according to another embodiment of the invention.
Figure 15:
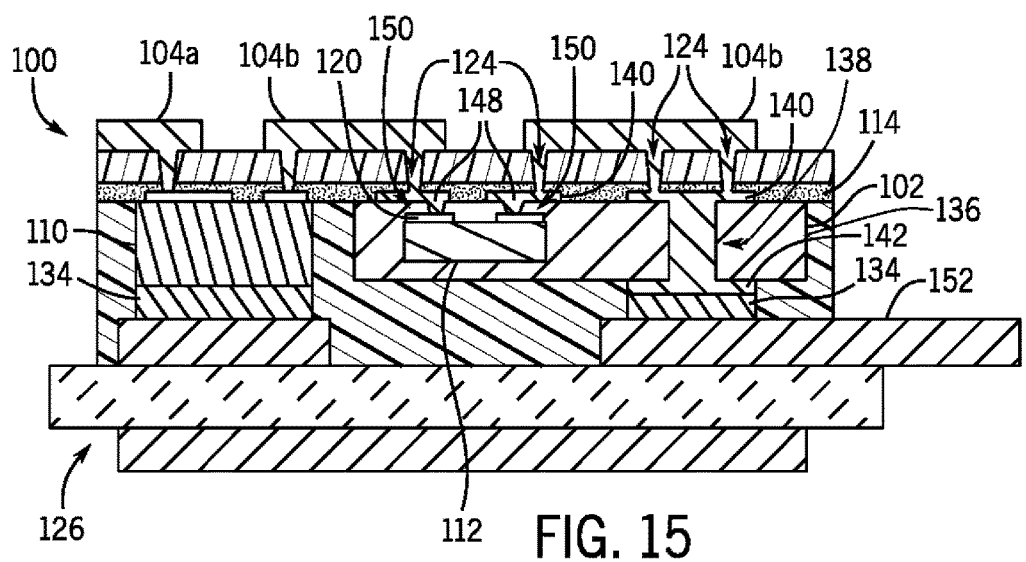
FIG. 15 is a schematic cross-sectional side view of the electronics package of FIG. 12, taken along line 13-13, according to another embodiment of the invention.

According to alternative embodiments, and as further shown in FIGS. 12, 13, 14, and 15, a connector 152 is integrated into the electronics package 100. FIG. 13 depicts a connector 152 integrated into the prefabricated PCB structure 102, FIG. 14 depicts a connector 152 attached to the prefabricated PCB structure 102 with a layer of conductive joining material 153 such as solder, and FIG. 15 depicts a connector 152 integrated into the multi-material conductor structure 126. The connector 152 provides a package input or output that enables surface mounting of the electronics package 100 to an external circuit, such as a printed circuit board. According to an exemplary embodiment, the connector 152 is in the form of a rigid flex circuit integrated into the prefabricated PCB structure 102 prior to placement of the prefabricated PCB structure 102 onto layer of insulating adhesive 114 and insulating substrate 108, such as by extending bottom plate 142 and removing a portion of the PCB core 136 forming connector 152 as depicted in FIG. 13. According to another exemplary embodiment, the connector 152 is in the form a flexible lead attached to top plate 140 or the bottom plate 142 (FIG. 14) such as by way of soldering to either the top plate(s) 140 or bottom plate(s) 142 of prefabricated PCB structure 102. According to yet another exemplary embodiment, the connector 152 is in the form of an extension of patterned copper 130 (FIG. 15). These versions of the connector 152 are formed prior to integrating the PCB structure into the electronic package although it is recognized that connector 152 could be post-attached instead (depending on the solder materials used), according to another embodiment of the invention. The connector 152 may then be cut and formed as desired to enable surface mounting of the electronics package 100 to an external circuit.

Referring now to FIGS. 16-20, a technique for manufacturing the electronics package 100 of FIGS. 7 and 8 is set forth, according to an embodiment of the invention. As one skilled in the art will recognize, the technique described herein may be modified to arrive at any of the electronics packages 100 of FIGS. 2-6 and 9-10. A cross-section of the build-up process for an electronics package 100 including only a single power semiconductor switch 110 and associated gate resistor 112 is shown in each of FIGS. 16-20 for ease of visualization of the build-up process. However, one skilled in the art will recognize that multiple power semiconductor switches 110 and associated gate resistors 112 could be included in the package, such as shown in FIG. 7.

Figure 16:
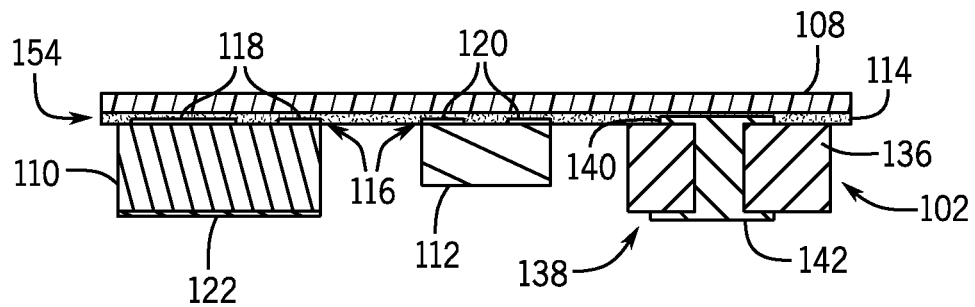
FIGS. 16-20 are schematic cross-sectional side views of the electronics package of FIG. 7 during various stages of a manufacturing/build-up process, according to an embodiment of the invention.

Referring first to FIG. 16, manufacturing of electronics package 100 begins by applying insulating adhesive 114 to a bottom surface 154 of insulating substrate 108. In the illustrated embodiment, insulating adhesive 114 is applied such that it coats the entirety of the bottom surface 154. In alternative embodiments, insulating adhesive 114 may be applied to coat only select portions of the bottom surface 154 of insulating substrate 108. Insulating adhesive 114 may be applied using a coating technique such as spin coating or slot die coating, using a lamination or spray process, or may be applied by a programmable dispensing tool in the form of an inkjet printing-type device technique, as non-limiting examples.

A power semiconductor switch 110, such as an IGBT or SiC MOSFET for example, and associated gate resistor 112 are coupled to insulating substrate 108 by positioning the active surfaces 116 of the respective devices on the insulating adhesive 114 using conventional pick and place equipment and methods, as shown in FIG. 16. A prefabricated, embedded pass-through structure 102, or "prefabricated PCB structure," is also coupled to insulating substrate 108 by positioning the prefabricated PCB structure 102 on the insulating adhesive 114 using pick and place equipment and methods. The prefabricated PCB structure 102 is attached such that a top plate 140 of each of a number of plated through-hole structures 138 of the prefabricated PCB structure 102 is positioned adjacent insulating adhesive 114, while a bottom plate 142 of each of the plated through-hole structures 138 is positioned opposite the top plate 140 and left exposed.

After devices 110, 112 and prefabricated PCB structure 102 are positioned, insulating adhesive 114 is fully cured, thermally or by way of a combination of heat or radiation. Suitable radiation may include UV light and/or microwaves. In one embodiment, a partial vacuum and/or above atmospheric pressure may be used to promote the removal of volatiles from the adhesive during cure if any are present.

Figure 17:
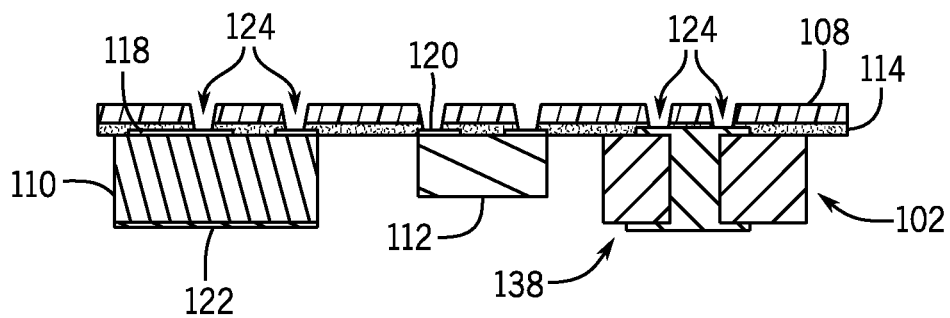

Referring now to FIG. 17, upon curing of insulating adhesive 114, a plurality of vias 124 are formed through insulating substrate 108 and insulating adhesive 114 to expose contact pads 118, 120 of each device and to expose each plated through-hole structure 138 (i.e., top plate 140) of prefabricated PCB structure 102. Vias 124 may be formed by a UV laser drilling or dry etching, photo-definition, or mechanical drilling process as non-limiting examples. Alternately, vias 124 may be formed by way of other methods including: plasma etching, dry and wet etching, or other laser techniques like CO2 and excimer. In one embodiment, vias 124 are formed having angled side surfaces, as shown in FIG. 16, to facilitate later filling and metal deposition. While the formation of vias 124 through insulating substrate 108 and insulating adhesive 114 is shown in FIG. 16 as being performed after placement of power semiconductor switch 110, gate resistor 112, and prefabricated PCB structure 102 onto insulating adhesive 114, it is recognized that the placement of devices and prefabricated PCB structure 102 could occur after via formation. Furthermore, a combination of pre- and post-drilled vias 124 could be employed.

Figure 18:
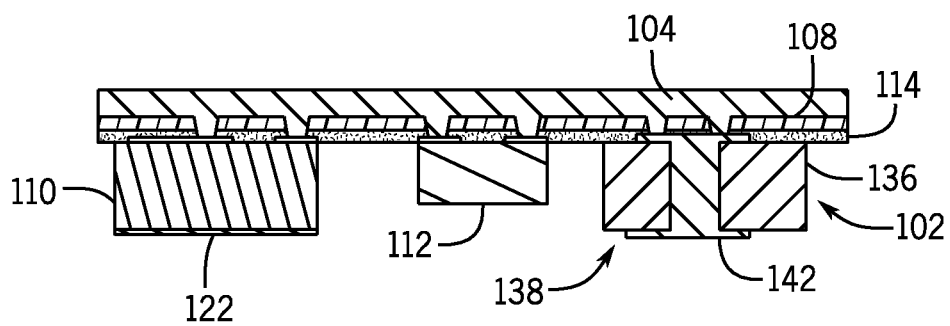

Upon securing devices 110, 112 and prefabricated PCB structure 102 onto the insulating substrate 108 and following the formation of vias 124, the vias 124 are cleaned (such as through a reactive ion etching (RIE) desoot process or laser process) and subsequently metalized to form conductor layer 104, as shown in FIG. 18. In one embodiment, the conductor layer 104 is formed by applying a layer of copper directly to the top surface of insulating substrate 108 using a sputtering and electroplating technique, although it is recognized that other electroless methods of metal deposition could also be used. Alternatively, a titanium adhesion layer and copper seed layer (not shown) may first be applied to insulating substrate 108 via a sputtering process, followed by an electroplating process that increases a thickness of the conductor layer 104 to a desired level. In either embodiment, conductor layer 104 extends through vias 124 and electrically couples with contact pads 118, 120 of devices and with top plates 140 of plated through-hole structures of the prefabricated PCB structure 102.

Figure 19:
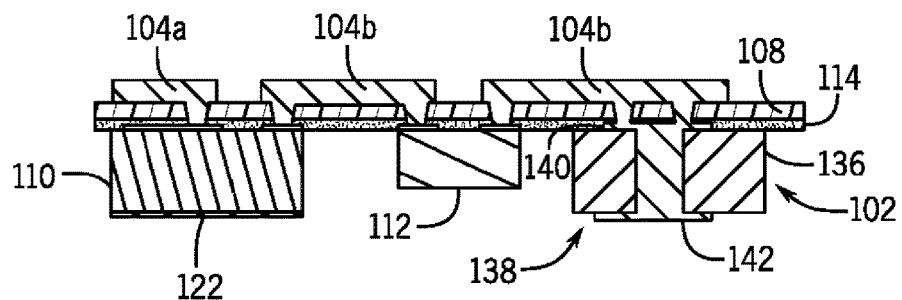

Upon deposition of conductor layer 104, a patterning and etching of the conductor layer 104 is performed in order to form a patterned conductor layer 104—including first and second conductor layer portions 104a, 104b— that extends out from contact pads 118, 120 of devices and from top plates 140 of the prefabricated PCB structure 102, through vias 124, and out across the top surface of insulating substrate 108. While not shown in FIG. 19, it is recognized that such patterning and etching may be performed by first forming a photoresist mask on the conductor layer 104 and patterning the mask with openings, with a patterning of the conductor layer 104 then being subsequently performed using an etching process to yield a patterned conductor layer 104 as shown in FIG. 19. According to one embodiment, a solder mask layer (not shown) may be applied over the conductor layer 104 of electronics package to provide a protective coating therefore and/or to define interconnect pads, with input/output (I/O) connections (not shown) then being formed to provide a route for electrical connections between the power semiconductor device 110 and external components (not shown) such as, for example a busbar or printed circuit board. Such I/O connections may be provided in the form of plated bumps or pillar bumps, as non-limiting examples.

Figure 20:
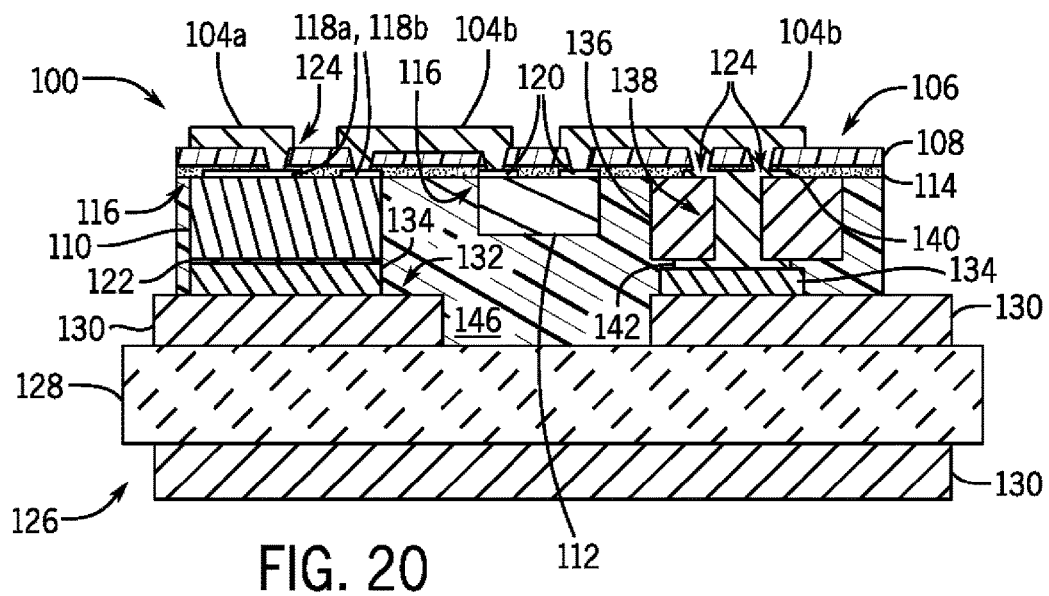

In another step of the manufacturing process, which may be performed subsequent to or prior to the via formation and metallization steps shown and described in FIGS. 17-19, a multi-material conductor substrate 126 (e.g., DBC structure) is provided on the back side of electronics package, as shown in FIG. 20. The power semiconductor switch 110 and prefabricated PCB structure 102 are electrically coupled to a top surface 132 of the multi-material conductor structure 126, with a bottom collector pad 122 of power semiconductor switch 110 being joined to the multi-material conductor structure 126, and bottom plates 142 of the of plated through-hole structures 138 of the prefabricated PCB structure 102 being joined to the multi-material conductor structure 126. Upon electrically coupling of the multi-material conductor structure 126 to power semiconductor switch 110 and prefabricated PCB structure 102, an electrically insulating material 146 is applied about the devices 110, 112 and prefabricated PCB structure 102 to fill in a volume between insulating substrate 108 and multi-material conductor structure 126 and fill in gaps in the electronics package 100, so as to provide rigidity in electronics package, moisture protection, and ease of handling. The electrically insulating material 146 may be in the form of a dielectric polymeric underfill or encapsulate or overmold applied using capillary flow (capillary underfill), no-flow underfill, or injection molding (molding compounds), for example. In alternative embodiments, insulating material 146 may be omitted and a conformal coating applied to exposed surfaces of electronics package 100 except for I/O leads or contacts.

Figure 21:
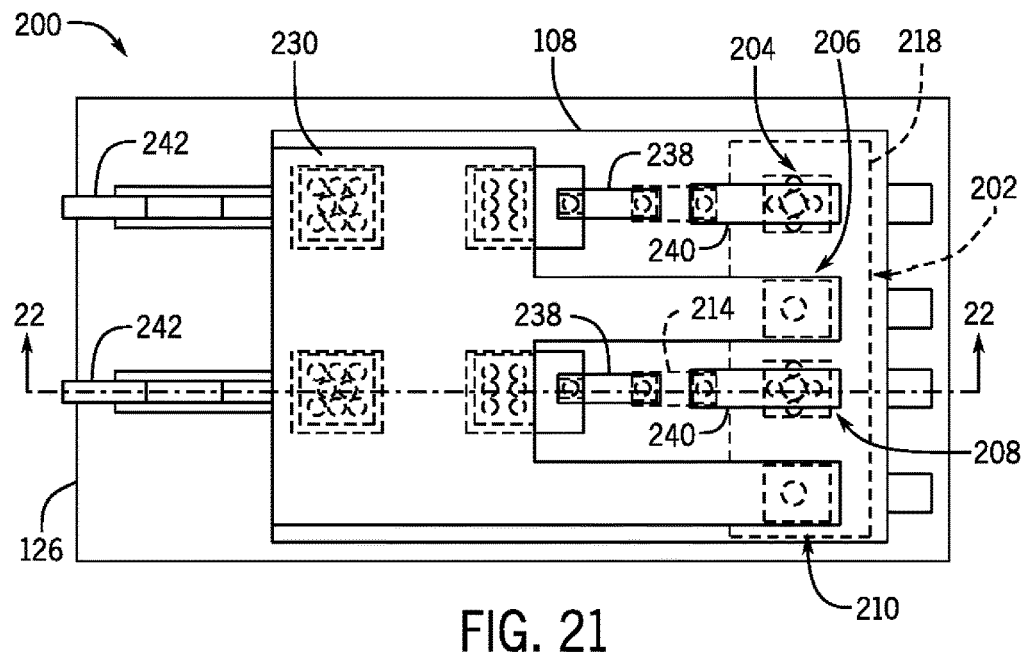
FIG. 21 is a schematic top view of an electronics package, according to another embodiment of the invention.

In a preferred embodiment, the prefabricated PCB structure 102 with its through-hole structures 138, would be fabricated as a standard fiberglass-epoxy printed circuit board with the fiberglass-epoxy layer forming the insulating core 136, copper plating forming the top plate 142 and bottom plate 144 and plated through holes forming the through-hole structures 138. In other preferred embodiments, a resistor 112 can be inserted into a cavity formed in the fiberglass-epoxy core and encapsulated using a resin. Vias can be formed to resistor contact pads 120. One skilled in the art would recognize that other circuit board structures and other methods could be used to form the prefabricated PCB structure 102. FIG. 21 illustrates an electronics package 200 according to another embodiment of the invention. Electronics package 200 includes a pass-through structure 202 constructed having through-hole structures 204, 206, 208, 210 that are electrically coupled to multiple semiconductor devices 212 and associated electrical components 214, 216, such as, for example, resistors and diodes, respectively. Electronics package 200 also includes a number of similar components as the various electronics packages 100 of FIGS. 2-10, and similar part numbering for those components will be used herein as appropriate.

Figure 22:
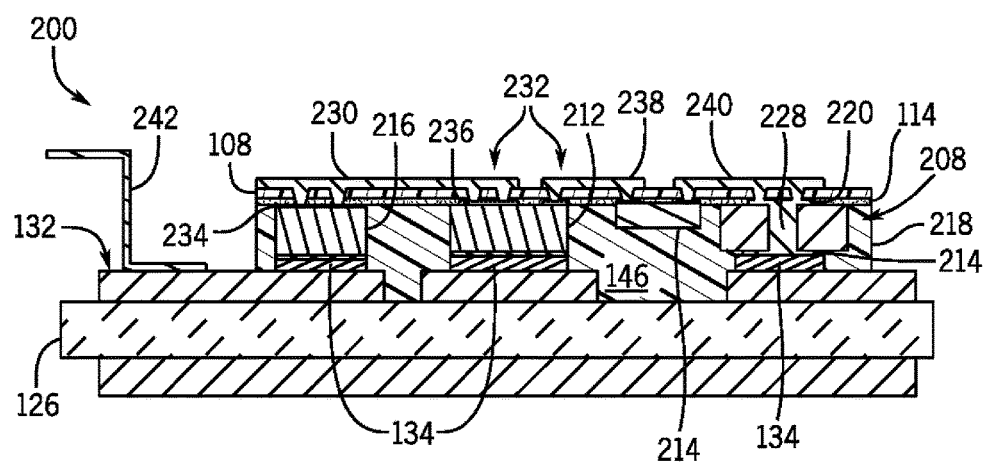
FIG. 22 is a schematic cross-section side view of the electronics package of FIG. 21, taken along line 21-21.

Referring now to FIG. 21 in combination with the associated cross-sectional view of electronics package 200 shown in FIG. 22, pass-through structure 202 is constructed in a similar manner as the pass-through structure 102 of FIG. 2, with electrically conductive through-hole structures 204-210 formed through the thickness of an insulating core 218.

In the embodiment shown, each through-hole structure 204-210 includes a top plate 220 formed on a top surface 222 of insulating core 218, a bottom plate 224 formed on a bottom surface 226 of insulating core 218, and a conductive body 228 electrically coupling the top and bottom plates 220, 224. A top view of pass-through structure 202 is shown in FIG. 23 prior to assembly within electronics package 200 to clarify the arrangement of top plates 220 and their respective conductive bodies 228 relative to insulating core 218. In one embodiment, bottom plates 224 may be arranged in a similar manner on the bottom surface of insulating core 218.

In yet another embodiment, the bottom plates 224 of the plated through-hole structures 204-210 may be formed as part of a metallization layer patterned on the bottom surface of insulating core 218. As one non-limiting example shown in FIG. 24, bottom plates 224 are replaced by a first metallized trace 225 that electrically couples plated through-hole structures 204, 208 and a second metallized trace 227 that electrically couples plated through-hole structures 206, 210. Such an arrangement simplifies external electrical connections to the gate, source, and drain power. In alternative embodiments, either or both of top and bottom plates 220, 224 may be omitted and electrical connections may be made directly to conductive bodies 228.

Referring again to FIGS. 21 and 22, through-hole structures 204, 208 are electrically coupled to a first patterned conductor 230 of a patterned metallization layer 232 formed on the top surface of insulating substrate 108. As shown, first patterned conductor 230 extends through vias in insulating substrate 108 to electrically couple with one or more contact pads 234 of diodes 216 and one or more contact pads 236 of semiconductor devices 212. Metallization layer 232 also includes second and third patterned conductors 238, 240 that extend through vias in insulating substrate 108 to electrically couple semiconductor devices 212 to respective through-hole structures 206, 210 through resistors 214.

In the embodiment shown in FIG. 21, first patterned conductor 230 busses together the source return connections from multiple semiconductor devices 212. While not shown in the figures, one skilled in the art will recognize that the gate connections from resistors 214 may similarly be bussed before connecting to one or more respective through-hole structures. When utilizing these types of bussed connections, a pass-through structure 202 having less (or more) through-hole structures than devices may be employed.

Similar to electronics package 100, semiconductor devices 212, diodes 216, and through-hole structures 204-210 are coupled to multi-material conductor structure 126 with a layer of electrically conductive joining material 134. A connector 242 coupled to a top surface 132 of the multi-material conductor structure 126 provides an I/O to a module terminal (not shown).

Figure 25:
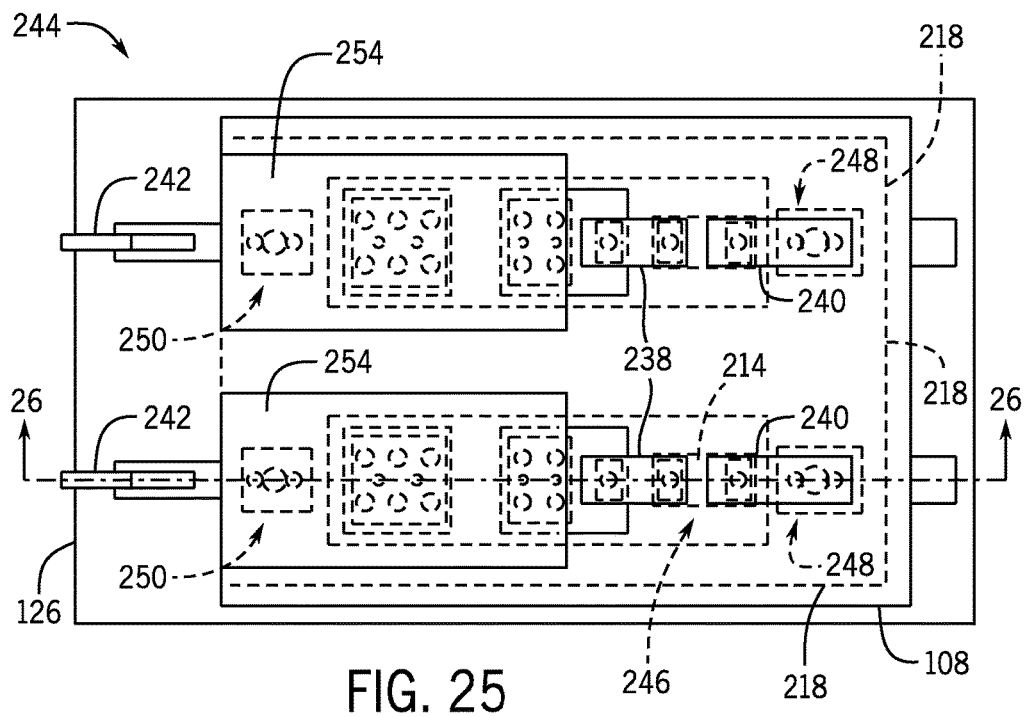
FIG. 25 is a schematic top view of an electronics package, according to yet another embodiment of the invention.
Figure 26:
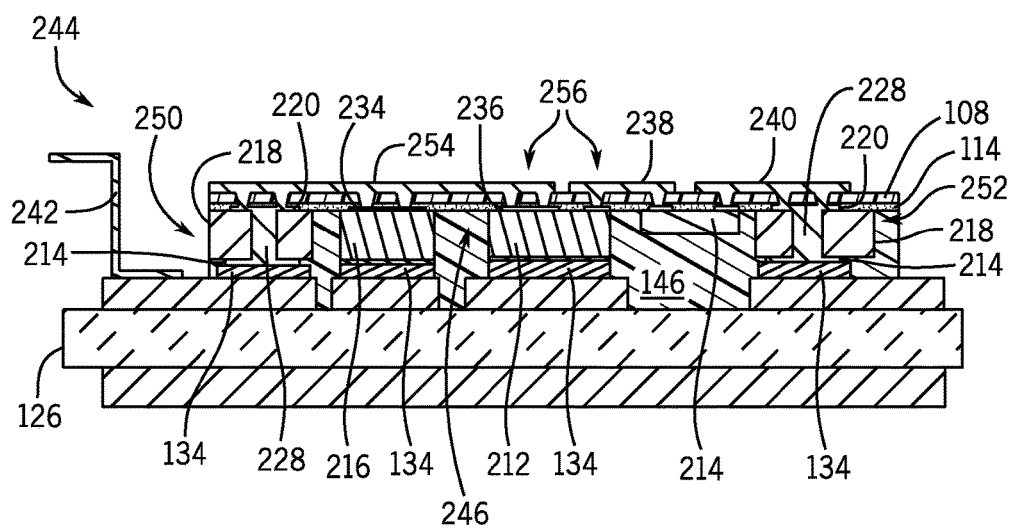
FIG. 26 is a schematic cross-section side view of the electronics package of FIG. 25, taken along line 25-25.

FIGS. 25 and 26 provide respective top and cross-sectional views of an electronics package 244 according to another embodiment of the invention. Components of electronics package 244 similar to those of electronics package 200 (FIG. 21) and/or electronics packages 100 (FIG. 2-10) are referred to with similar part numbers as appropriate. Electronics package 244 differs from electronics package 200 of FIG. 21 in that the semiconductor devices 212, resistors 214, and diodes 216 are positioned within respective wells or openings 246 formed within the insulating core 218 of a pass-through structure 252. While electronics package 244 is depicted as including two semiconductor devices 212, it is contemplated that the arrangement depicted therein may be extended to electronics packages containing a single semiconductor device in combination with one or more additional electrical components or three or more semiconductor devices alone or in combination with one or more associated electrical components.

While each set of devices 212, 214, 216 is depicted as being positioned within its own respective opening 246 in insulating core 218, pass-through structure 252 may be formed having a single opening sized large enough to accommodate all devices 212, 214, 216 provided within electronics package 244 or any subset thereof. Alternatively, individual openings may be formed in insulating core 218 to accommodate each device 212, 214, 216. In yet another embodiment, pass-through structure 252 may be formed in two separate sections, with a first section including through-hole structures 248 (similar to pass-through structure 102 of FIG. 7) and a second section including through-hole structures 250.

Still referring to FIGS. 25, and 26, plated through-hole structures 248, 250 of pass-through structure 252 are positioned on opposite sides of each respective arrangement of diode 216, semiconductor device 212, and resistor 214, with one plated through-hole structure 248 positioned proximate diode 216 and the other plated through-hole structure 250 positioned proximate resistor 214. This arrangement permits the patterned conductors 254 of metallization layer 256 that are electrically coupled to the contact pads 236 of respective semiconductor devices 212 to be formed with a simplified geometry and less material, resulting in potential cost savings in the overall electronics package 244. In the illustrated embodiment the two patterned conductors 254 are electrically isolated from one another. In an alternative embodiment, metallization layer 256 may be patterned to form a single patterned conductor electrically coupled to both semiconductor devices 212, similar to first patterned conductor 230 of FIG. 21.

Figure 27:
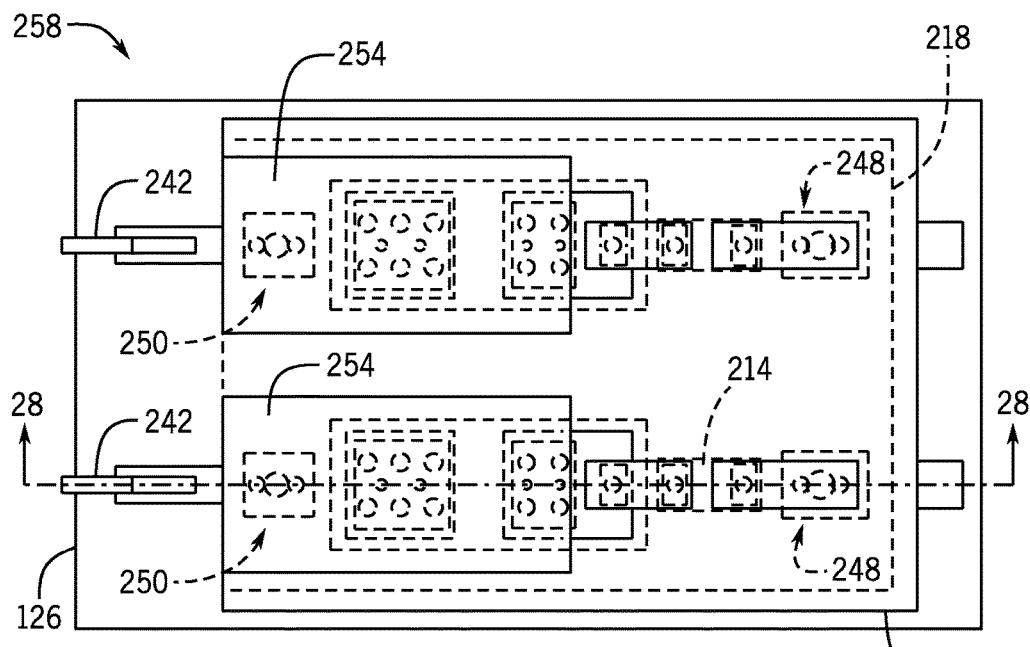
FIG. 27 is a schematic top view of an electronics package, according to yet another embodiment of the invention.
Figure 28:
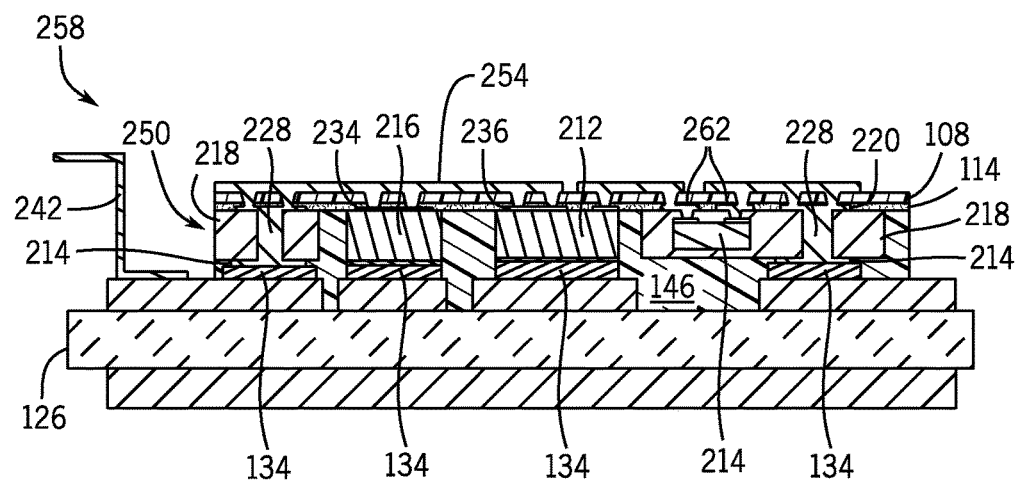
FIG. 28 is a schematic cross-section side view of the electronics package of FIG. 27, taken along line 27-27.

Referring now to FIGS. 27 and 28, an electronics package 258 is illustrated according to yet another embodiment that leverages aspects of electronics package 244 (FIG. 25) and electronics package 100 (FIG. 10), with similar part numbering again being used with common components as appropriate. As shown, electronics package 258 includes a metallized conductor 254 patterned similar to that of electronics package 244 that extends through vias in insulating substrate 108 to electrically couple with through-hole structures 250, contact pads 234 of diodes 216, and contact pads 236 of semiconductor devices 212. Similar to electronics package 100 of FIG. 10, the resistors 214 of electronics package 258 are embedded within the insulating core 218 of pass-through structure 252. A portion 262 of the top plate 220 of pass-through structure 252 extends through vias formed in the insulating core 218 to electrically couple with contact pads 264 of each resistor 214.

Each diode 216 and semiconductor device 212 pair may be positioned within a respective opening 260 formed within insulating core 218 as shown. Alternatively, insulating core 218 may be formed having an opening sized to accommodate all diodes 216 and semiconductor devices 212 or individual openings sized to separately receive each semiconductor device 212 and diode 216. In yet another embodiment, pass-through structure 252 may be formed in two separate sections, with a first section including embedded resistors 214 and through-hole structures 248 (similar to pass-through structure 102 of FIG. 10) and a second section including through-hole structures 250.

One skilled in the art will understand that the technique described with respect to FIGS. 16-20 may be used with minor modifications to manufacture the electronics packages 200, 244, and 258 of FIGS. 21-22, 25-26, and 27-28. Additionally, it is contemplated that while electronics packages 200 are illustrated as including two semiconductor devices with associated diodes and resistors, the general construction of electronics packages 200, 244, and 258 may be extended to electronics packages including a single semiconductor device in combination with one or more additional electrical components or three or more semiconductor devices provided with any number of additional electrical components.

Beneficially, embodiments of the invention thus provide a prefabricated structure containing multiple through-hole connections and/or resistors that may be embedded within an electrical package in a single pick and place operation, thereby saving manufacturing time. The prefabricated structure can be pre-tested to increase overall package yield and be manufactured at a reduced cost as compared to discrete shims.

Therefore, according to one embodiment of the invention, an electronics package includes an insulating substrate, a semiconductor device having a top surface coupled to a first side of the insulating substrate, and a pass-through component coupled to the first side of the insulating substrate. The pass-through component includes an insulating core and at least one through-hole structure comprising a conductive body extending through the thickness of the insulating core. A metallization layer is formed on a second side of the insulating substrate and extends through at least one via in the insulating substrate to electrically couple at least one conductive pad on the top surface of the semiconductor device to the at least one through-hole structure. An insulating material surrounds the semiconductor device and the insulating core of the pass-through component.

According to another embodiment of the invention, a method of manufacturing an electrical package includes providing an insulating substrate, coupling a semiconductor device to a first surface of the insulating substrate, and coupling a pass-through structure to the first surface of the insulating substrate, the pass-through structure comprising a core substrate and at least one electrical feed through extending through a thickness of the core substrate. The method also includes forming a first metallization path on a second surface of the insulating substrate, the first metallization path extending through at least one via in the insulating substrate to electrically couple at least one pad of the semiconductor device to at least one electrical feed through of the pass-through structure. The method further includes applying an insulating material about the semiconductor device and the core substrate of the pass-through structure.

According to yet another embodiment of the invention, an electronics package includes a plurality of semiconductor devices coupled to a first side of an insulating substrate and at least one structure coupled to the first side of the insulating substrate. The at least one structure includes an insulating core and a plurality of electrically conducting through-hole structures extending through the insulating core and across a portion of a top surface and a portion of a bottom surface thereof. A metallization layer is formed on a second surface of the insulating substrate and extends through a plurality of vias therein. An insulating material is applied around the plurality of semiconductor devices and the insulating core. The metallization layer electrically connects at least one contact pad of a first semiconductor device of the plurality of semiconductor devices to at least one electrically conducting through-hole structure of the plurality of electrically conducting through-hole structures. The metallization layer also electrically connects at least one contact pad of a second semiconductor device of the plurality of semiconductor devices to at least one other electrically conducting through-hole structure of the plurality of electrically conducting through-hole structures.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. An electronics package comprising:
   an insulating substrate;
   a semiconductor device having a top surface coupled to a first side of the insulating substrate;
   a pass-through component coupled to the first side of the insulating substrate, the pass-through component comprising:
      a core; and
      at least one through-hole structure comprising a conductive body extending through the thickness of the core;
   a metallization layer formed on a second side of the insulating substrate and extending through at least one via in the insulating substrate to electrically couple at least one conductive pad on the top surface of the semiconductor device to the at least one through-hole structure; and
   an insulating material surrounding the semiconductor device and the core of the pass-through component.

2. The electronics package of claim 1 wherein the pass-through component comprises at least a first through-hole structure and a second through-hole structure; and
   wherein the metallization layer further comprises:
      a first patterned conductor extending through at least one via in the insulating substrate to electrically couple a first conductive pad on the top surface of the semiconductor device to the first through-hole structure; and
      at least a second patterned conductor extending through at least one via in the insulating substrate to electrically couple a second conductive pad on the top surface of the semiconductor device to the second through-hole structure.

3. The electronics package of claim 2 further comprising a resistor; and
   wherein the at least a second patterned conductor comprises:
      a second patterned conductor electrically coupling the second conductive pad of the semiconductor device to a first conductive pad of the resistor; and
      a third patterned conductor electrically coupling a second conductive pad of the resistor to a top plate of the second through-hole structure.

4. The electronics package of claim 3 wherein the resistor is coupled to the first side of the insulating substrate.

5. The electronics package of claim 3 wherein the semiconductor device is a power semiconductor device and the second conductive pad comprises a gate connection of the power semiconductor device; and
   wherein the resistor comprises a gate resistor.

6. The electronics package of claim 2 wherein the semiconductor device is a high frequency semiconductor device and the second conductive pad comprises an input connection of the semiconductor device.

7. The electronics package of claim 1 wherein the top surface of the semiconductor device and a top surface of the pass-through component are co-planar or substantially co-planar.

8. The electronics package of claim 1 wherein the at least one through-hole structure further comprises a conductive pad formed on a bottom surface of the core and electrically coupled to the conductive body.

9. The electronics package of claim 8 wherein the at least one through-hole structure further comprises a conductive pad formed on a top surface of the core and electrically coupled to the conductive body.

10. The electronics package of claim 1 further comprising a multi-material conductor structure coupled to a bottom surface of the semiconductor device and coupled to a bottom plate of the at least one through-hole structure.

11. The electronics package of claim 10 wherein the multi-material conductor structure further comprises an extended connector formed out of a conductor layer of the multi-material conductor structure.

12. The electronics package of claim 1 wherein the electrically insulating material and the core differ in material composition.

13. The electronics package of claim 1 wherein the semiconductor device comprises one of a Silicon device and a wide band gap device.

14. The electronics package of claim 1 wherein the pass-through component further comprises a flexible connector coupled to one of a top plate and a bottom plate of the at least one through-hole structure.

15. The electronics package of claim 1 wherein the core of the pass-through component comprises a printed circuit board (PCB) material.

16. A method of manufacturing an electrical package comprising:
   coupling a semiconductor device to a first surface of an insulating substrate;
   coupling a pass-through structure to the first surface of the insulating substrate, the pass-through structure comprising a core substrate and at least one electrical feed through extending through a thickness of the core substrate;
   forming a first metallization path on a second surface of the insulating substrate, the first metallization path extending through at least one via in the insulating substrate to electrically couple at least one pad of the semiconductor device to at least one electrical feed through of the pass-through structure; and
   applying an insulating material about the semiconductor device and the core substrate of the pass-through structure.

17. The method of claim 16 further comprising:
   forming the first metallization path to electrically couple at least one pad of the semiconductor device to a first electrical feed through of the pass-through structure; and
   forming at least a second metallization path on the second surface of the insulating substrate, the at least a second metallization path extending through at least one via in the insulating substrate to electrically couple a second pad of the semiconductor device to a second electrical feed through of the pass-through structure.

18. The method of claim 17 further comprising coupling a resistor to the first surface of the insulating substrate; and
wherein forming the at least a second metallization path comprises:
forming a second metallization path extending through vias in the insulating substrate to electrically couple a first pad of the resistor with the second pad of the semiconductor device; and
forming a third metallization path extending through vias in the insulating substrate to electrically couple a second pad of the resistor with the second electrical feed through.

19. The method of claim 16 further comprising coupling a bottom surface of the semiconductor device and a bottom plate of the at least one electrical feed through to a multi-material conductor structure, wherein the bottom plate of the at least one electrical feed through is electrically coupled to the conductive body of the respective electrical feed through.

20. The method of claim 16 further comprising coupling a multi-material conductor structure to a bottom surface of the semiconductor device and a bottom plate of the at least one electrical feed through; and
wherein applying the insulting material further comprises filling voids between the insulating substrate and the multi-material conductor structure with an insulating material distinct from the core substrate of the pass-through structure.

21. The method of claim 20 further comprising forming a connector out of a conductor layer of the multi-material conductor structure.

22. The method of claim 16 further comprising coupling a flexible connector to a bottom plate of the at least one electrical feed through.

23. An electronics package comprising:
a plurality of semiconductor devices coupled to a first side of an insulating substrate;
at least one structure coupled to the first side of the insulating substrate, the at least one structure comprising:
a core; and
a plurality of electrically conducting through-hole structures extending through the core and across a portion of a top surface and a portion of a bottom surface thereof;
a metallization layer formed on a second surface of the insulating substrate and extending through a plurality of vias therein; and
an insulating material applied around the plurality of semiconductor devices and the core;
wherein the metallization layer electrically connects at least one contact pad of a first semiconductor device of the plurality of semiconductor devices to at least one electrically conducting through-hole structure of the plurality of electrically conducting through-hole structures; and
wherein the metallization layer electrically connects at least one contact pad of a second semiconductor device of the plurality of semiconductor devices to at least one other electrically conducting through-hole structure of the plurality of electrically conducting through-hole structures.

24. The electronics package of claim 23 further comprising a resistor coupled to the first side of the insulating substrate; and
wherein the metallization layer electrically couples a contact pad of the first semiconductor device to a first electrically conducting through-hole structure of the plurality of electrically conducting through-hole structures through the resistor.

25. The electronics package of claim 23 wherein the metallization layer further comprises:
a first metallization path electrically coupling a first contact pad of the first semiconductor device to a first electrically conducting through-hole structure of the plurality of electrically conducting through-hole structures; and
one or more additional metallization paths electrically coupling a second contact pad of the first semiconductor device to a second electrically conducting through-hole structure of the plurality of electrically conducting through-hole structures.

26. The electronics package of claim 23 further comprising a multi-material conductor structure coupled to bottom surfaces of the plurality of semiconductor devices and coupled to bottom plates of the plurality of electrically conducting through-hole structures.

27. The electronics package of claim 23 wherein the insulating material has a material composition that differs from a material composition of the core.

* * * * *